United States Patent
Sobue

(10) Patent No.: US 11,295,987 B2
(45) Date of Patent: Apr. 5, 2022

(54) OUTPUT CIRCUIT

(71) Applicant: SOCIONEXT INC., Kanagawa (JP)

(72) Inventor: Isaya Sobue, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 16/905,136

(22) Filed: Jun. 18, 2020

(65) Prior Publication Data

US 2020/0321254 A1    Oct. 8, 2020

Related U.S. Application Data

(63) Continuation of application No. PCT/JP2018/043800, filed on Nov. 28, 2018.

(30) Foreign Application Priority Data

Dec. 25, 2017 (JP) .............................. JP2017-247638

(51) Int. Cl.

| H01L 27/02 | (2006.01) |
| H01L 21/8234 | (2006.01) |
| H01L 21/02 | (2006.01) |
| H01L 27/092 | (2006.01) |
| H01L 29/06 | (2006.01) |
| H01L 29/423 | (2006.01) |

(Continued)

(52) U.S. Cl.
CPC ........... *H01L 21/823487* (2013.01); *H01L 21/02603* (2013.01); *H01L 27/0207* (2013.01); *H01L 27/092* (2013.01); *H01L 29/0676* (2013.01); *H01L 29/42312* (2013.01); *H01L 29/7827* (2013.01); *B82Y 10/00* (2013.01)

(58) Field of Classification Search
None
See application file for complete search history.

(56) References Cited

U.S. PATENT DOCUMENTS

| 9,281,363 B2 | 3/2016 | Chen |
| 2013/0240983 A1 | 9/2013 | Larrieu |

(Continued)

FOREIGN PATENT DOCUMENTS

| JP | 2008-205168 A | 9/2008 |
| JP | 2014-503998 A | 2/2014 |

(Continued)

OTHER PUBLICATIONS

International Search Report issued in International Patent Application No. PCT/JP2018/043800, dated Feb. 19, 2019; with English translation.

(Continued)

*Primary Examiner* — Hsien Ming Lee
(74) *Attorney, Agent, or Firm* — McDermott Will & Emery LLP

(57) ABSTRACT

A layout structure of an output circuit using vertical nanowire (VNW) FETs is provided. The output circuit includes a transistor of a first conductivity type provided between a power supply and an output signal line and configured to receive an output control signal at its gate. The transistor includes a plurality of VNW FETs placed in an array in the X and Y directions, and the plurality of VNW FETs have tops connected to the output signal line, bottoms to which a power supply voltage is supplied, and gates to which the output control signal is supplied.

5 Claims, 23 Drawing Sheets

(51) Int. Cl.
*H01L 29/78* (2006.01)
*B82Y 10/00* (2011.01)

(56) References Cited

U.S. PATENT DOCUMENTS

| | | |
|---|---|---|
| 2016/0063163 A1 | 3/2016 | Moroz et al. |
| 2017/0011929 A1 | 1/2017 | Jun et al. |
| 2021/0082902 A1* | 3/2021 | Sobue ............ H01L 21/823871 |

FOREIGN PATENT DOCUMENTS

| | | |
|---|---|---|
| JP | 2017-520908 A | 7/2017 |
| WO | 2012/069606 A2 | 5/2012 |
| WO | 2015/191096 A1 | 12/2015 |

OTHER PUBLICATIONS

Written Opinion of the International Searching Authority issued in International Patent Application No. PCT/JP2018/043800, dated Feb. 19, 2019; with English translation.

* cited by examiner

OUTPUT CIRCUIT

CROSS-REFERENCE TO RELATED APPLICATIONS

This is a continuation of International Application No. PCT/JP2018/043800 filed on Nov. 28, 2018, which claims priority to Japanese Patent Application No. 2017-247638 filed on Dec. 25, 2017. The entire disclosures of these applications are incorporated by reference herein.

BACKGROUND

The present disclosure relates to a semiconductor integrated circuit device provided with vertical nanowire (VNW) field effect transistors (FETs), and more particularly to a layout structure of an output circuit.

A semiconductor integrated circuit device is provided with input/output circuits that input/output signals from/to the outside via input/output pads. For an output circuit in the input/output circuits, which passes a large current, full attention must be paid to its layout structure.

Regarding transistors as basic constituents of an LSI, improvement in integration degree, reduction in operating voltage, and improvement in operating speed have been achieved thanks to the scaling of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

U.S. Pat. No. 9,281,363 discloses a layout structure of a semiconductor integrated circuit using VNW FETs.

SUMMARY

The cited patent document does not disclose any specific layout structure related to a circuit that passes a large current through an output pad, like an output circuit in input/output circuits.

An objective of the present disclosure is providing a layout structure of an output circuit using VNW FETs.

In the first mode of the present disclosure, an output circuit for outputting a signal from a semiconductor integrated circuit includes a first transistor of a first conductivity type provided between a first power supply and an output signal line and configured to receive a first output control signal at its gate, wherein the first transistor includes a plurality of first vertical nanowire (VNW) FETs placed in an array in a first direction and a second direction perpendicular to the first direction, and the plurality of first VNW FETs have tops connected to the output signal line, bottoms to which a first power supply voltage is supplied from the first power supply, and gates to which the first output control signal is supplied.

According to the above mode, in the output circuit, the first transistor of the first conductivity type provided between the first power supply and the output signal line and configured to receive the first output control signal at its gate is constituted by a plurality of first VNW FETs placed in an array. This makes it possible to configure an output circuit that passes a large current through an output pad using VNW FETs.

In the second mode of the present disclosure, an output circuit for outputting a signal from a semiconductor integrated circuit includes first and second transistors of a first conductivity type provided in series between a first power supply and an output signal line, wherein the first transistor receives a first output control signal at its gate, and the second transistor receives a second output control signal at its gate, the first transistor includes a plurality of first vertical nanowire (VNW) FETs placed in an array in a first direction and a second direction perpendicular to the first direction, the plurality of first VNW FETs have tops to which a first power supply voltage is supplied from the first power supply, gates to which the first output control signal is supplied, and bottoms connected to a first bottom region, the second transistor includes a plurality of second VNW FETs placed in an array in the first direction and the second direction, and the plurality of second VNW FETs have tops connected to the output signal line, gates to which the second output control signal is supplied, and bottoms connected to the first bottom region.

According to the above mode, in the output circuit, the first and second transistors of the first conductivity type provided in series between the first power supply and the output signal line and configured to receive the first and second output control signals at their gates are respectively constituted by a plurality of first VNW FETs placed in an array and a plurality of second VNW FETs placed in an array. This makes it possible to configure an output circuit that passes a large current through an output pad using VNW FETs.

According to the present disclosure, an output circuit that passes a large current through an output pad can be configured using VNW FETs.

BRIEF DESCRIPTION OF THE DRAWINGS

FIG. 22A is a cross-sectional view and FIG. 22B is a plan view.

DETAILED DESCRIPTION

Embodiments of the present disclosure will be described hereinafter with reference to the accompanying drawings. In the following embodiments, it is assumed that a semiconductor integrated circuit device includes a plurality of IO cells and that at least some of the plurality of IO cells include so-called vertical nanowire FETs (VNW FETs).

Figure 22A:
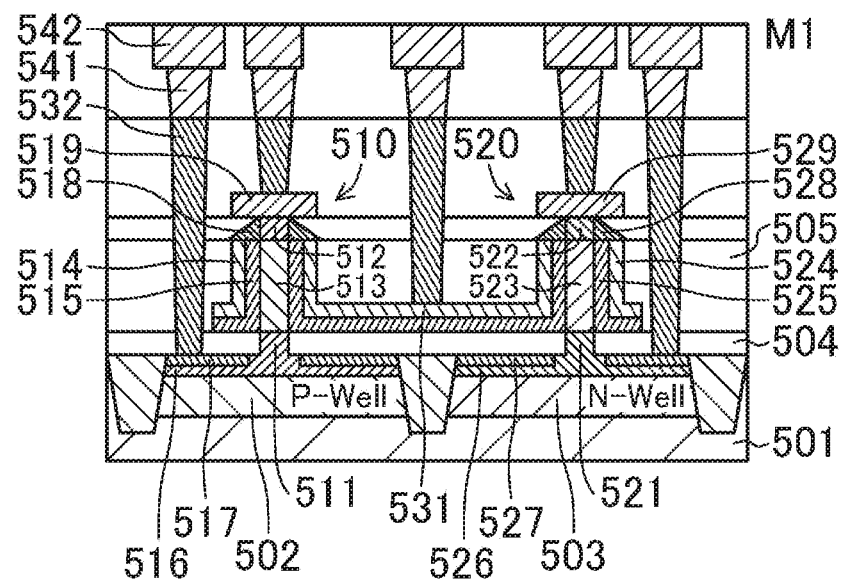
FIGS. 22A and 22B are schematic views showing a basic structure example of vertical nanowire FETs, where
Figure 22B:
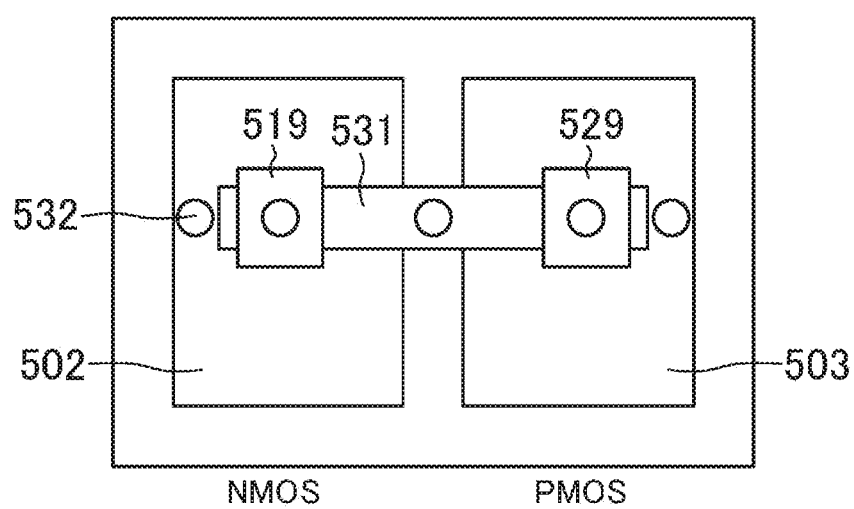

FIGS. 22A and 22B are schematic views showing a basic structure example of VNW FETs, where FIG. 22A is a cross-sectional view and FIG. 22B is a plan view. Note that, in FIG. 22B, illustration of metal interconnects is omitted and, for easy understanding, constituents invisible when actually viewed from top are illustrated.

As shown in FIGS. 22A and 22B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 22A and 22B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiA, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 23A:
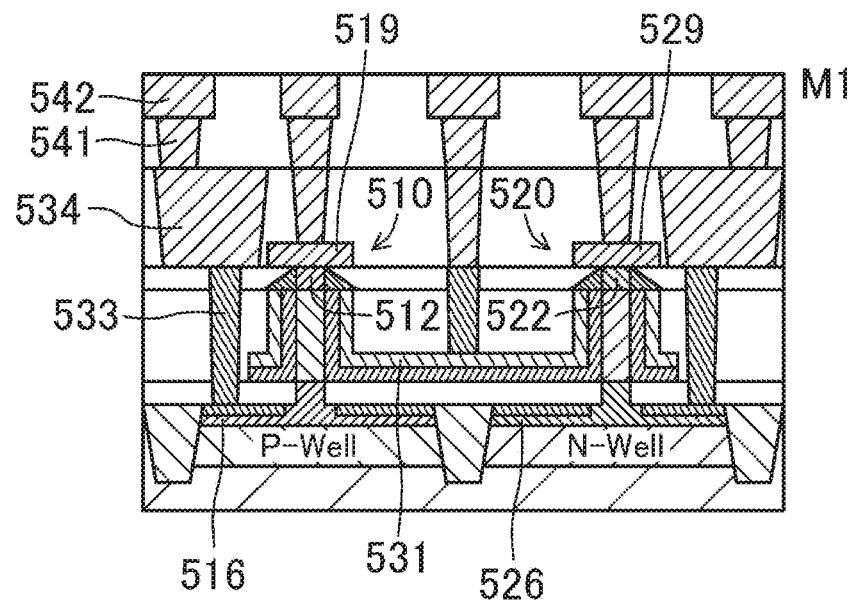
FIGS. 23A and 23B are schematic cross-sectional views showing basic structure examples of vertical nanowire FETs in which local interconnects are used.
Figure 23B:
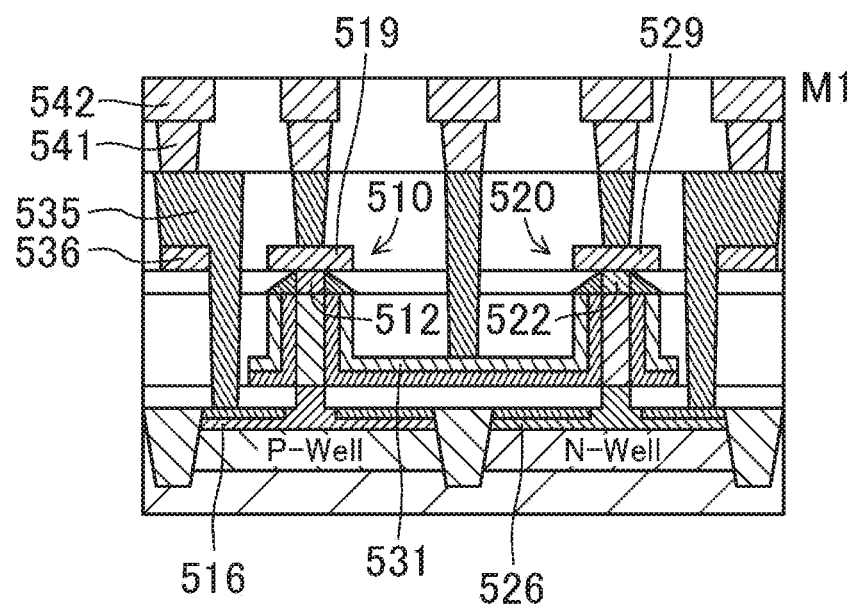

FIGS. 23A and 23B show basic structure examples of VNW FETs in which local interconnects are used. In FIG. 23A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 23B, local interconnects 535 are formed between the metal interconnect layer M1 and the bottom regions 516 and 526. In other words, the local interconnect 535 corresponds to an integrated form of the contact 533 and the local interconnect 534 in FIG. 23A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, when one or a plurality of configuration units each constituted by a vertical nanowire, a top, a bottom, and a gate constitute one VNW FET, this configuration unit is simply referred to as a "VNW" to distinguish this from the VNW FET.

As used herein, an expression indicating that widths, etc. are the same, like the "same interconnect width" should be understood as including a range of fabrication variations.

First Embodiment

Figure 1:
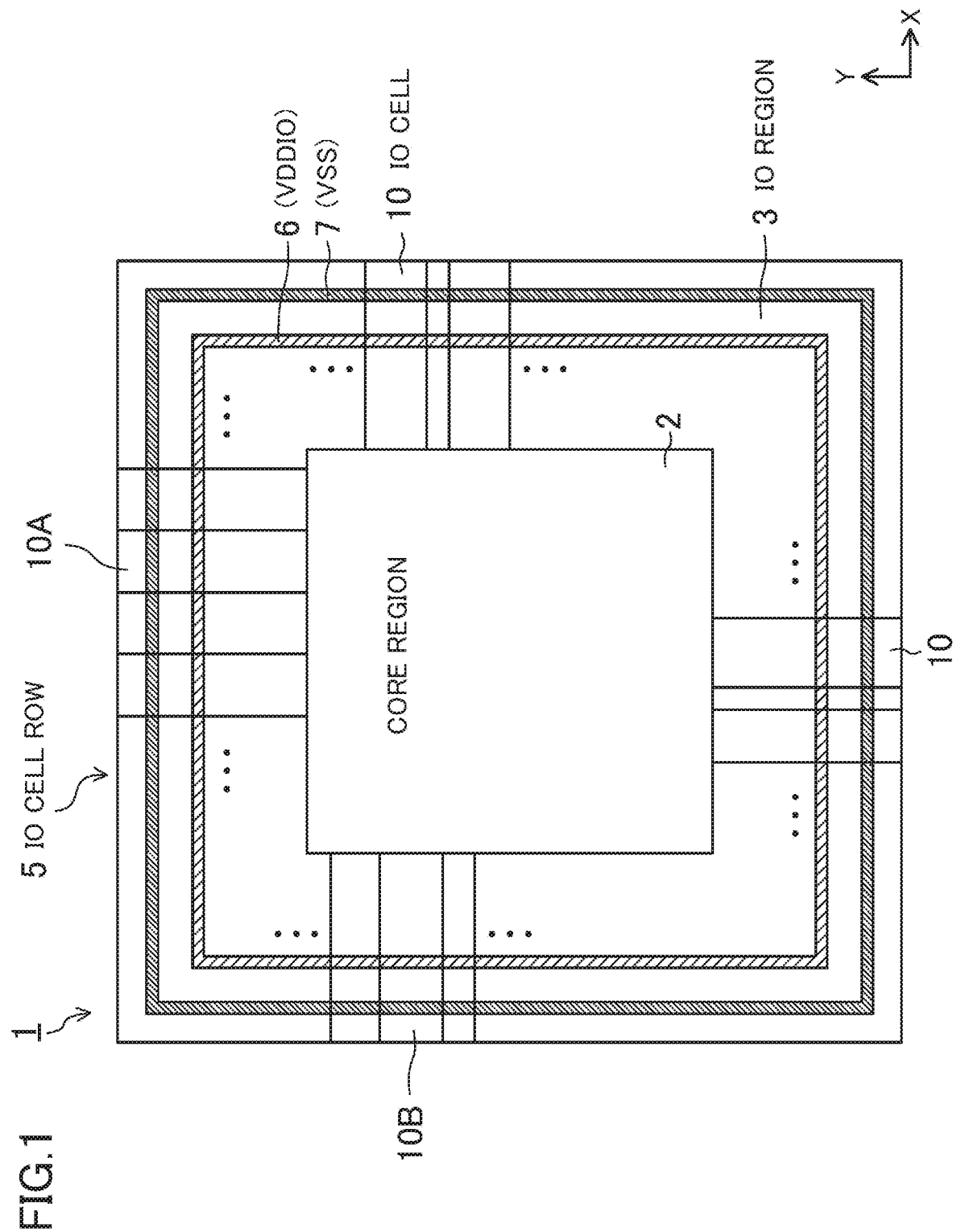
FIG. 1 is a plan view schematically showing the entire configuration of a semiconductor integrated circuit device according to an embodiment.

FIG. 1 is a plan view schematically showing the entire configuration of a semiconductor integrated circuit device (semiconductor chip) according to an embodiment. In FIG. 1, the horizontal direction as viewed from the figure is referred to as the X direction, and the vertical direction as the Y direction (this also applies to the subsequent figures). The semiconductor integrated circuit device 1 shown in FIG. 1 has a core region 2 in which internal core circuits are formed and an IO region 3, surrounding the core region 2, in which interface circuits (IO circuits) are formed. In the IO region 3, an IO cell row 5 is provided along the periphery of the semiconductor integrated circuit device 1 so as to surround the core region 2. Although illustration is omitted in FIG. 1, the IO cell row 5 includes a plurality of IO cells 10 that constitute the interface circuits, placed in a line.

The IO cells 10 include signal IO cells for input, output, or input/output of signals, power supply IO cells for supply of the ground potential (power supply voltage VSS), and power supply IO cells for supply of power (power supply voltage VDDIO) mainly to the IO region 3. VDDIO is 3.3 V, for example. In FIG. 1, an IO cell 10A for signal input/output is placed on the upper side of the core region 2 as viewed from the figure, and an IO cell 11B for signal input/output is placed on the left side of the core region 2 as viewed from the figure.

In the IO region 3, power supply interconnects 6 and 7 are provided extending in the direction in which the IO cells 10 line up. The power supply interconnects 6 and 7 are each formed in a ring shape along the periphery of the semiconductor integrated circuit device 1 (which are therefore also referred to as the ring power supply interconnects). The power supply interconnect 6 supplies VDDIO and the power supply interconnect 7 supplies VSS. Although the power supply interconnects 6 and 7 are illustrated like single interconnects in FIG. 1, they each may actually be constituted by a plurality of interconnects. Also, although illustration is omitted in FIG. 1, a plurality of pads for external connection are provided in the semiconductor integrated circuit device 1.

Figure 2:
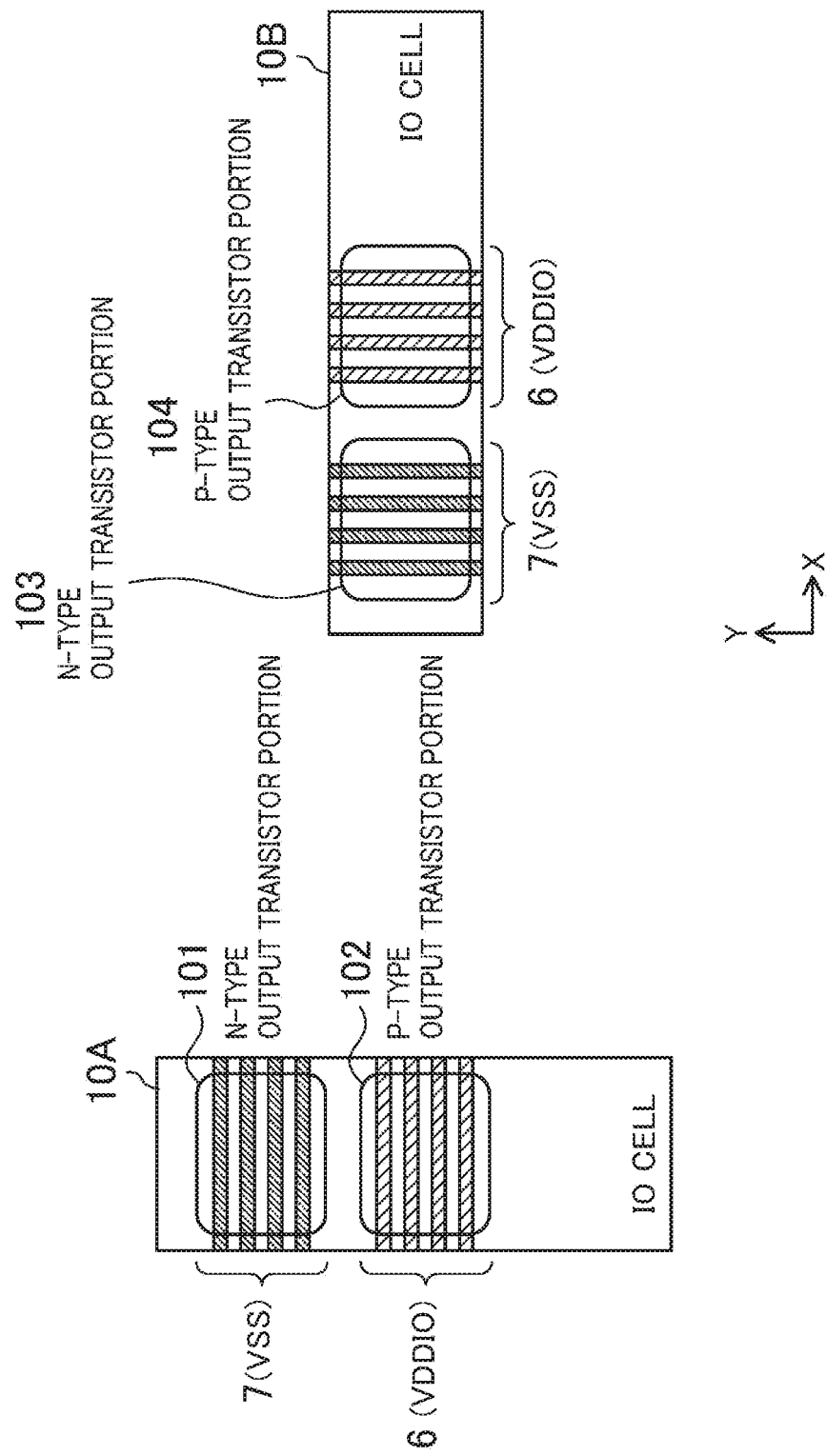
FIGS. 2A and 2B show simple configurations of IO cells in FIG. 1.

FIGS. 2A and 2B show simple configurations of the IO cells 10A and 10B. It is assumed in the subsequent description that the power supply interconnects 6 and 7 are each constituted by four interconnects. As shown in FIG. 2A, the power supply interconnects 6 and 7 extend in the X direction in the IO cell 10A. The IO cell 10A has an n-conductivity type (n-type) output transistor portion 101 under the power supply interconnect 7 and a p-conductivity type (p-type) output transistor portion 102 under the power supply interconnect 6. The n-type output transistor portion 101 and the p-type output transistor portion 102 are provided at positions closer to the outside of the chip in the IO cell 10A. Also, as shown in FIG. 2B, the power supply interconnects 6 and 7 extend in the Y direction in the IO cell 10B. The IO cell 10B has an n-type output transistor portion 103 under the power supply interconnect 7 and a p-type output transistor portion 104 under the power supply interconnect 6. The n-type output transistor portion 103 and the p-type output transistor portion 104 are provided at positions closer to the outside of the chip in the IO cell 10B.

Figure 3:
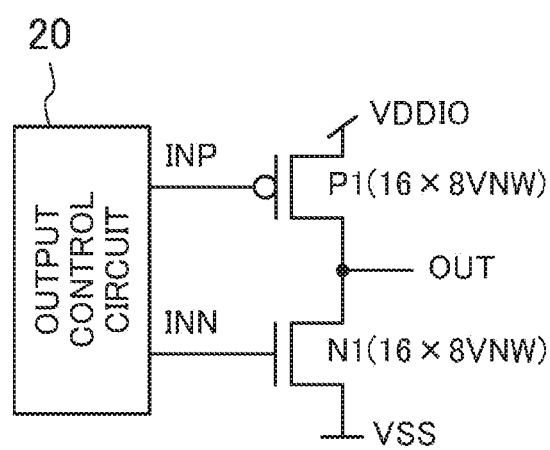
FIG. 3 is a circuit diagram of an output circuit in the first and second embodiments.

FIG. 3 is a circuit diagram of an output circuit in this embodiment. The output circuit of FIG. 3 has a p-conductivity type (hereinafter referred to as p-type as appropriate) transistor P1 between the power supply VDDIO and an output signal line (which outputs an output signal OUT) and an n-conductivity type (hereinafter referred to as n-type as appropriate) transistor N1 between the power supply VSS and the output signal line. An output control circuit 20 outputs output control signals INP and INN. The transistor P1 receives the output control signal INP at its gate, and the transistor N1 receives the output control signal INN at its gate. The output signal OUT is supplied to an external connection pad. The output signal OUT is high (VDDIO) when the output control signals INP and INN are low, and is low (VSS) when they are high.

Hereinafter, the layout structures of the two transistors P1 and N1 constituting the output circuit of FIG. 3 will be described. It is herein assumed that, taking the IO cell 10A shown in FIG. 2A as an example, the transistor N1 is constituted by the n-type output transistor portion 101 and the transistor P1 is constituted by the p-type output transistor portion 102.

Figure 4:
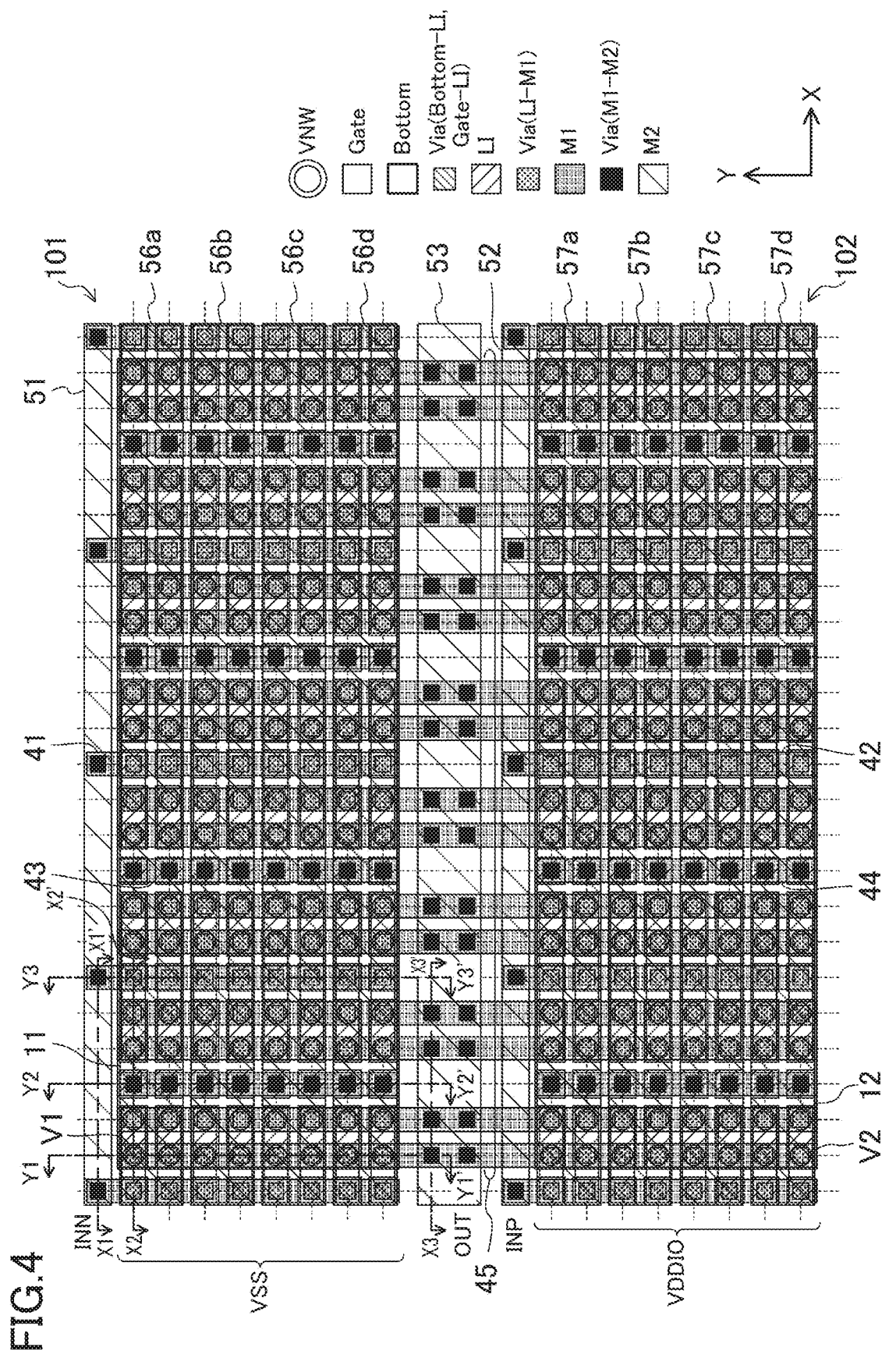
FIG. 4 is an overall plan view showing an example of a layout structure according to the first embodiment.
Figure 5:
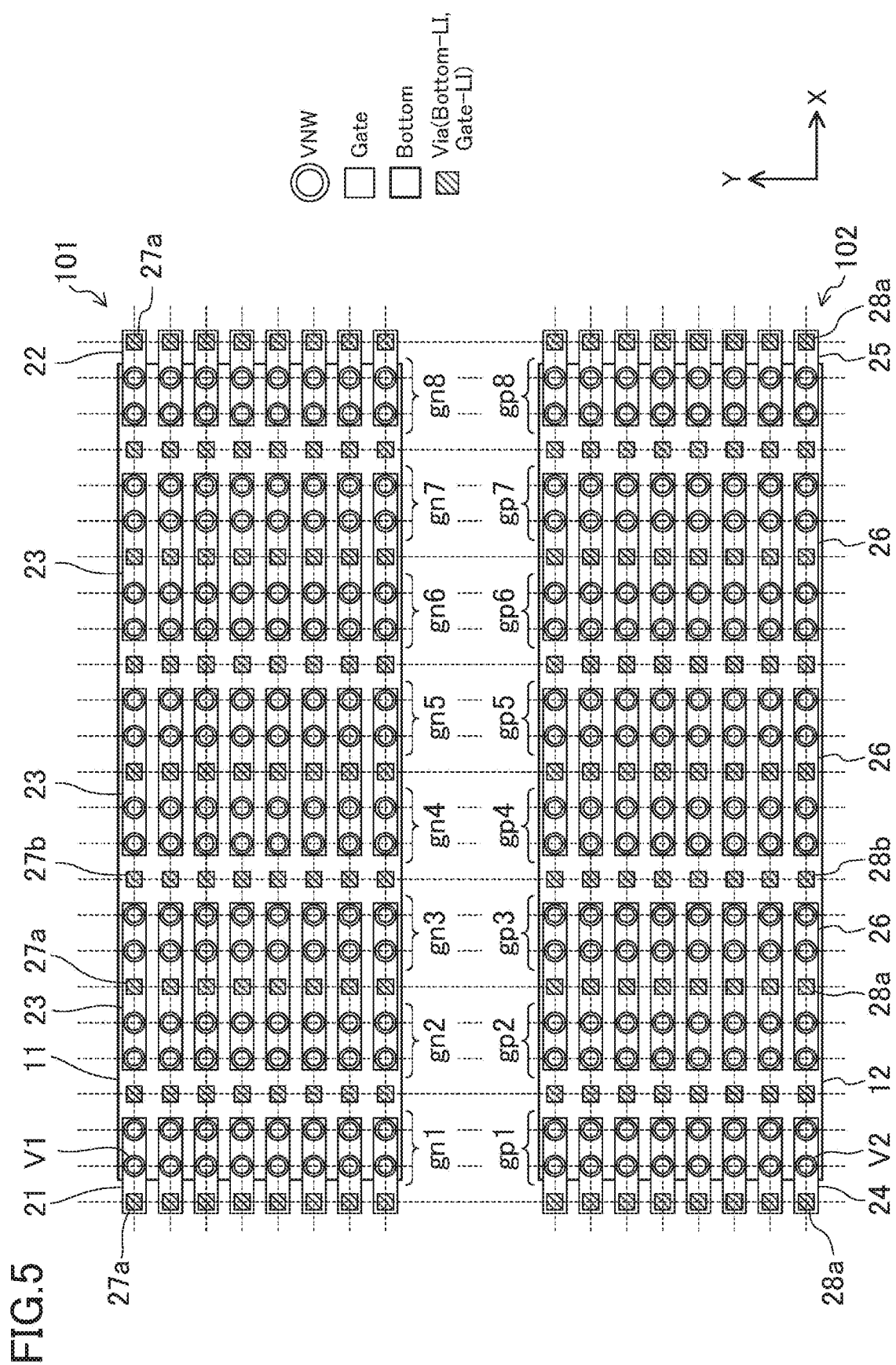
FIG. 5 is a layer-by-layer plan view showing the layout structure according to the first embodiment.
Figure 6:
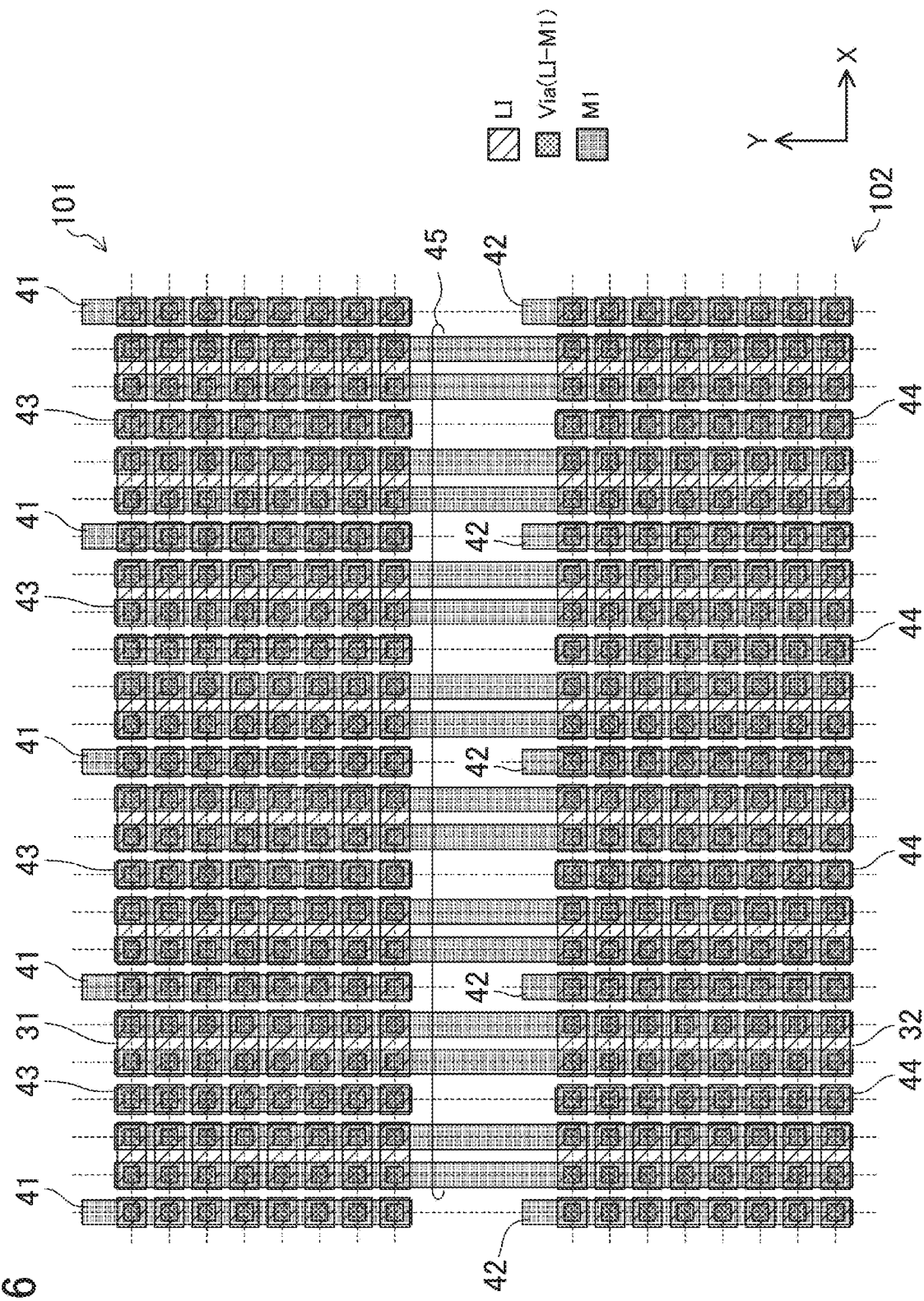
FIG. 6 is a layer-by-layer plan view showing the layout structure according to the first embodiment.
Figure 7:
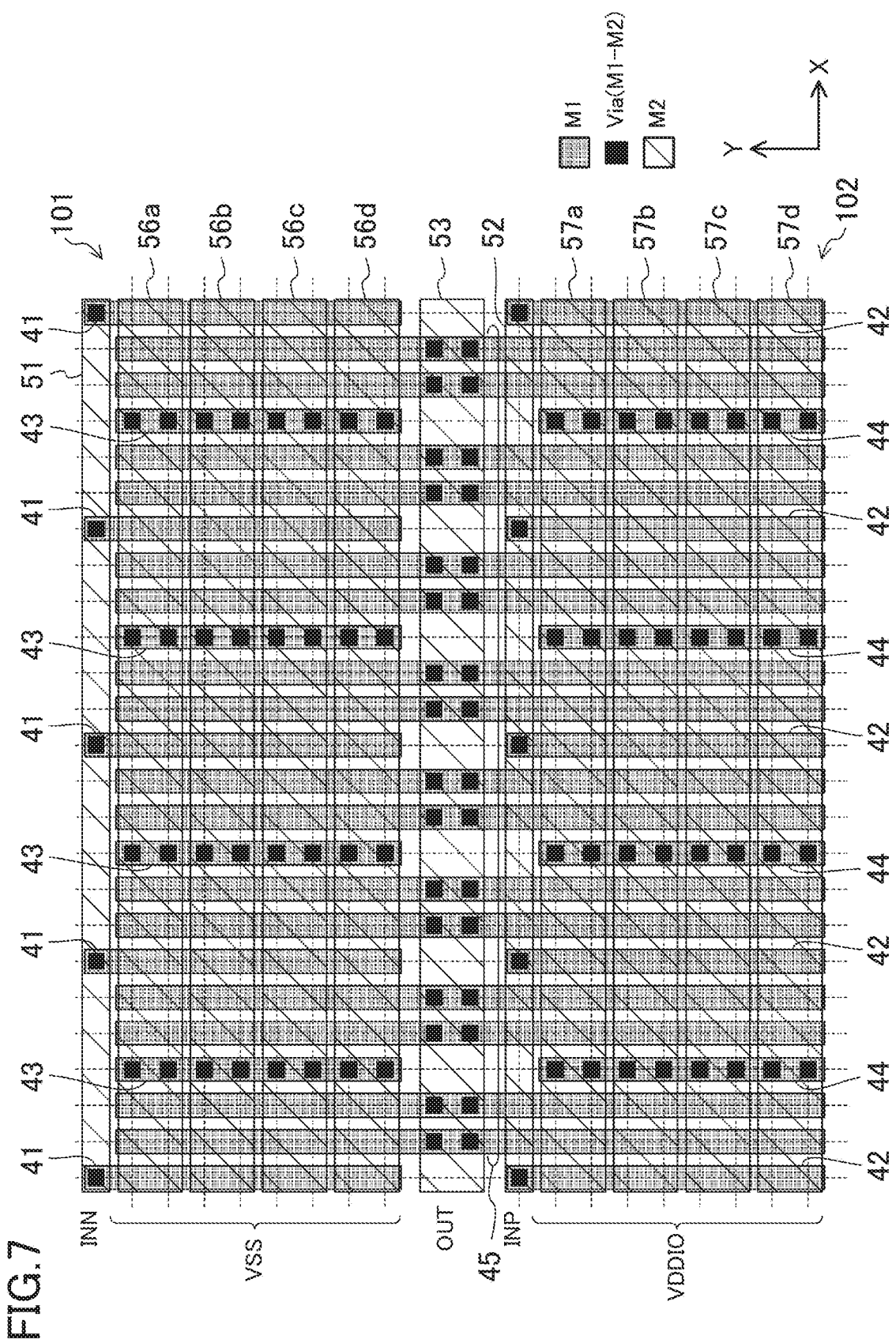
FIG. 7 is a layer-by-layer plan view showing the layout structure according to the first embodiment.
Figure 8:
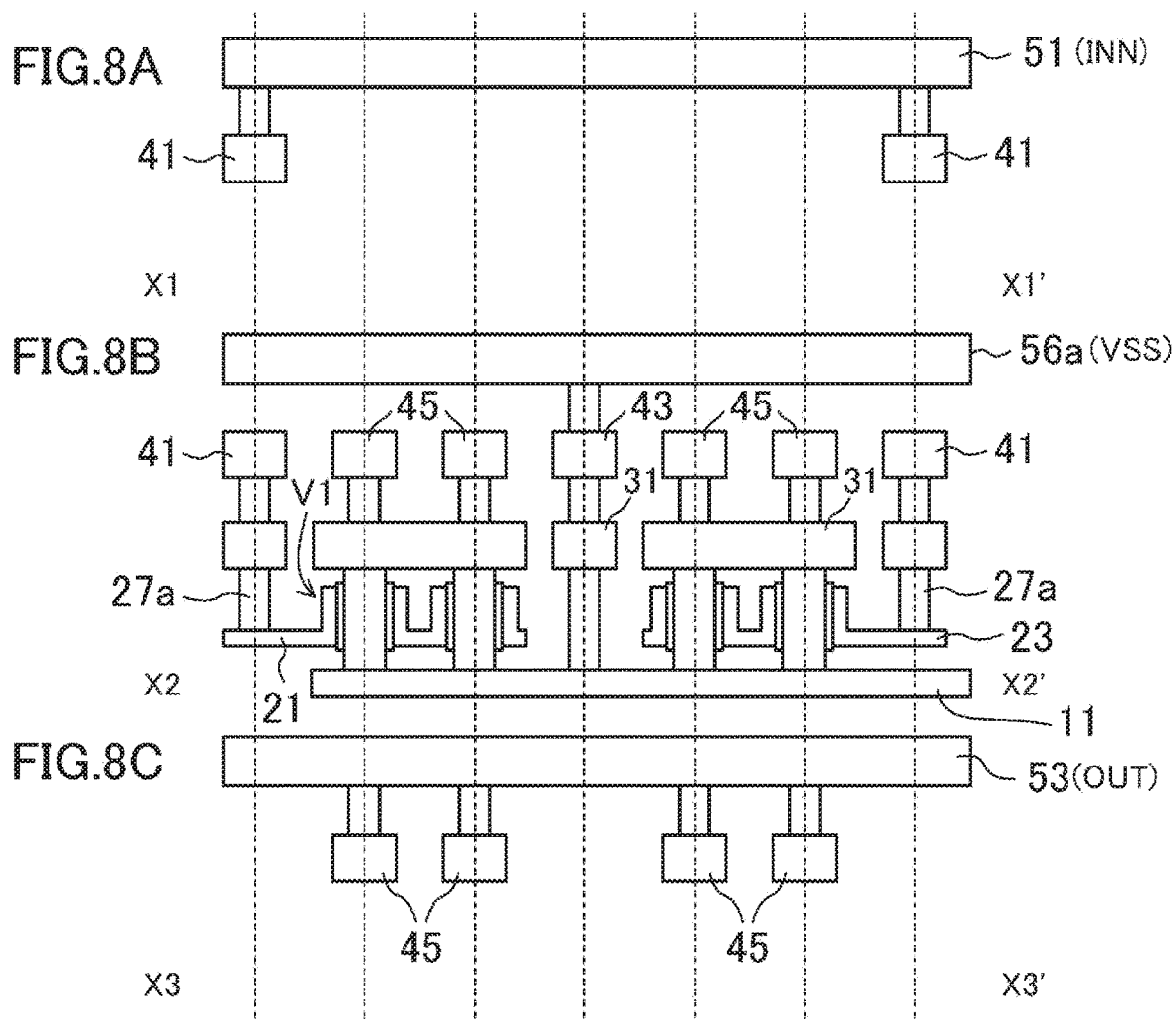
FIGS. 8A to 8C are cross-sectional views showing the layout structure according to the first embodiment.
Figure 9:
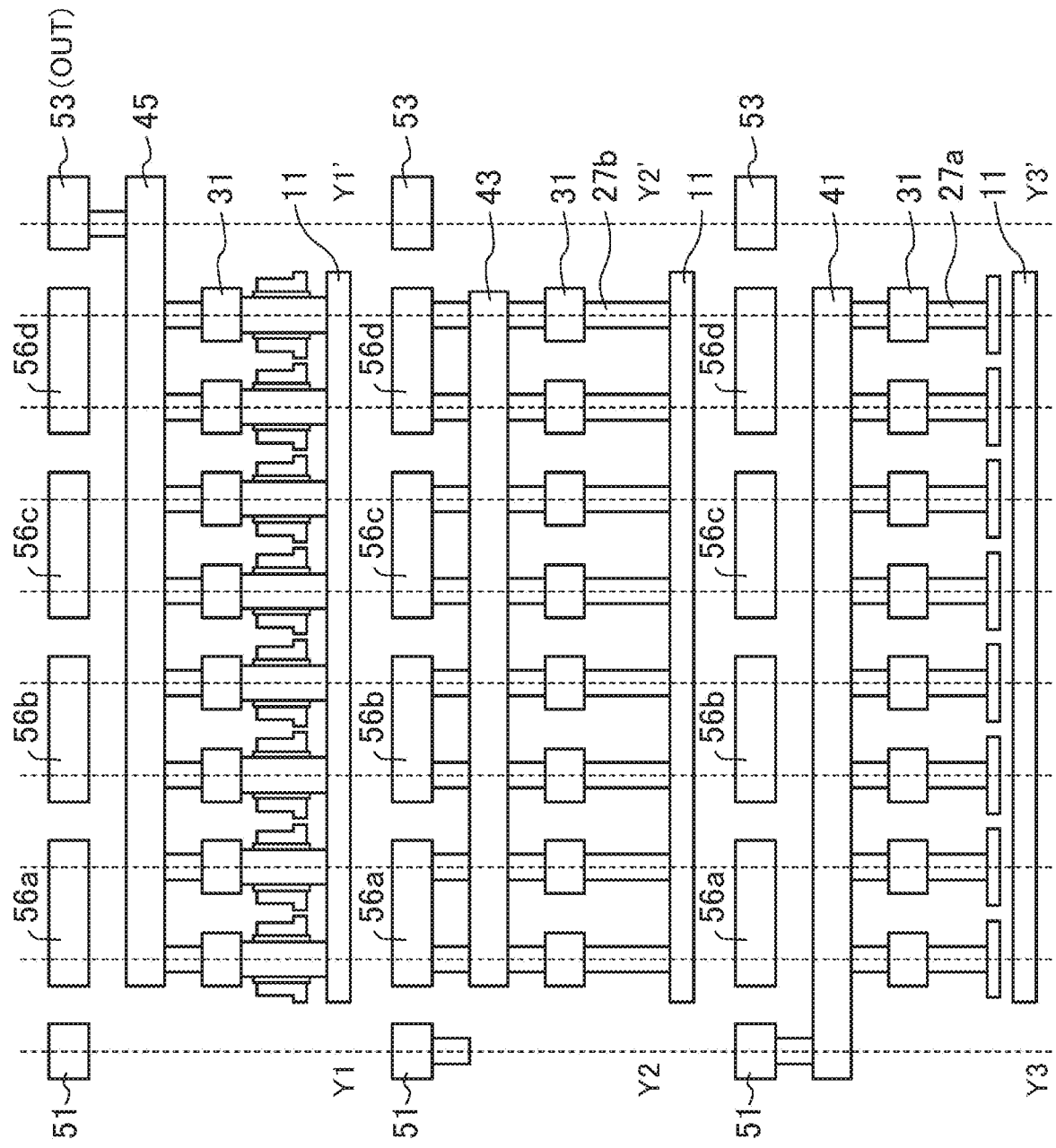
FIGS. 9A to 9C are cross-sectional views showing the layout structure according to the first embodiment.

FIGS. 4 to 7, 8A-8C, and 9A-9C are views showing an example of the layout structure of the transistors P1 and N1 according to this embodiment, where FIG. 4 is an overall plan view. FIGS. 5 to 7 are layer-by-layer plan views, and FIGS. 8A-8C and 9A-9C are cross-sectional views. Specifically, FIG. 5 shows VNW FETs and layers below them, FIG. 6 shows local interconnects and M1 interconnects above the VNW FETs, and FIG. 7 shows M1 and M2 interconnects. FIGS. 8A to 8C are cross-sectional views in the horizontal direction as viewed from top in FIG. 4, where FIG. 8A shows a cross section taken along line X1-X1', FIG. 8B shows a cross section taken along line X2-X2', and FIG. 8C shows a cross section taken along line X3-X3'. FIGS. 9A to 9C are cross-sectional views in the vertical direction as viewed from top in FIG. 4, where FIG. 9A shows a cross section taken along line Y1-Y1', FIG. 9B shows a cross section taken along line Y2-Y2', and FIG. 9C shows a cross section taken along line Y3-Y3'.

The dashed lines running vertically and horizontally in the plan views such as FIG. 4 and the dashed lines running vertically in the cross-sectional views such as FIGS. 8A-8C represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be arranged at different spacing. Further, the components may not be necessarily placed on grid lines. It is however preferable to place the components on grid lines from the standpoint of preventing or reducing fabrication variations.

The device structure of this embodiment is based on the structure of FIG. 23A, although it can be a structure based on the structure of FIG. 22 or FIG. 23B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

In the plan views such as FIG. 4, the upper part of the figure corresponds to the n-type output transistor portion 101 and implements the transistor N1 in the circuit of FIG. 3. The lower part of the figure corresponds to the p-type output transistor portion 102 and implements the transistor P1 in the circuit of FIG. 3.

As shown in FIG. 5, in the n-type output transistor portion 101, a total of 128 n-type VNWs V1 are formed in an array of 16 columns in the X direction and 8 rows in the Y direction. The transistor N1 is implemented by these 128 n-type VNWs V1. In the n-type output transistor portion 101, a bottom region 11 is formed almost over the entire surface, and the bottoms of the 128 VNWs V1 are connected to the bottom region 11.

The VNWs V1 are placed with spacing provided every two columns in the X direction. Groups of such two columns of VNWs V1 are herein denoted by gn1 to gn8. In each of the groups gn1 to gn8, the gates of VNWs V1 adjacent in the X direction are mutually connected. Gate interconnects 21 are drawn from the group gn1 leftward as viewed from the figure, and gate interconnects 22 are drawn from the group gn8 rightward as viewed from the figure. In the groups gn2 and gn3, four VNWs V1 adjacent in the X direction are connected with one another through a gate interconnect 23. That is, such gate interconnects 23 are gate interconnects drawn from the group gn2 rightward and also gate interconnects drawn from the group gn3 leftward as viewed from the figure. Likewise, in the groups gn4 and gn5, four VNWs V1 adjacent in the X direction are connected with one another through a gate interconnect 23, and in the groups gn6 and gn7, four VNWs V1 adjacent in the X direction are connected with one another through a gate interconnect 23.

Vias 27a for connection with local interconnects in an upper layer are formed on the gate interconnects 21, 22, and 23. Also, vias 27b for connection with local interconnects in the upper layer are formed on the bottom region 11 to line up in the Y direction between the groups gn1 and gn2, between the groups gn3 and gn4, between the groups gn5 and gn6, and between the groups gn7 and gn8.

Likewise, in the p-type output transistor portion 102, a total of 128 p-type VNWs V2 are formed in an array of 16 columns in the X direction and 8 rows in the Y direction. The transistor P1 is implemented by these 128 p-type VNWs V2. In the p-type output transistor portion 102, a bottom region 12 is formed almost over the entire surface, and the bottoms of the 128 VNWs V2 are connected to the bottom region 12.

The VNWs V2 are placed with spacing provided every two columns in the X direction. Groups of such two columns of VNWs V2 are herein denoted by gp1 to gp8. In each of the groups gp1 to gp8, the gates of VNWs V2 adjacent in the X direction are mutually connected. Gate interconnects 24 are drawn from the group gp1 leftward as viewed from the figure, and gate interconnects 25 are drawn from the group gp8 rightward as viewed from the figure. In the groups gp2 and gp3, four VNWs V2 adjacent in the X direction are connected with one another through a gate interconnect 26. That is, such gate interconnects 26 are gate interconnects drawn from the group gp2 rightward and also gate interconnects drawn from the group gp3 leftward as viewed from the figure. Likewise, in the groups gp4 and gp5, four VNWs V2 adjacent in the X direction are connected with one another through a gate interconnect 26, and in the groups gp6 and gp7, four VNWs V2 adjacent in the X direction are connected with one another through a gate interconnect 26.

Vias 28a for connection with local interconnects in an upper layer are formed on the gate interconnects 24, 25, and 26. Also, vias 28b for connection with local interconnects in the upper layer are formed on the bottom region 12 to line up in the Y direction between the groups gp1 and gp2, between the groups gp3 and gp4, between the groups gp5 and gp6, and between the groups gp7 and gp8.

As shown in FIG. 6, in each of the groups gn1 to gn8, the tops of VNWs V1 adjacent in the X direction are mutually connected through a local interconnect 31. Likewise, in each of the groups gp1 to gp8, the tops of VNWs V2 adjacent in the X direction are mutually connected through a local interconnect 32.

As shown in FIG. 7, in an M2 interconnect layer, M2 interconnects 51, 52, 53, 56a to 56d, and 57a to 57d extend in the X direction. The M2 interconnect 51 supplies the output control signal INN. The M2 interconnect 52 supplies the output control signal INP. The M2 interconnect 53 is a signal line that outputs the output signal OUT and corresponds to the output signal line according to the present disclosure. The M2 interconnects 56a to 56d are interconnects that supply the power supply voltage VSS and correspond to the power supply interconnect 7. The M2 interconnects 57a to 57d are interconnects that supply the power supply voltage VDDIO and correspond to the power supply interconnect 6.

In an M1 interconnect layer, M1 interconnects 41, 42, 43, 44, and 45 extend in the Y direction. The M1 interconnects 41, placed in the n-type output transistor portion 101, are connected with the M2 interconnect 51 that supplies the output control signal INN through vias. Likewise, the M1 interconnects 42, placed in the p-type output transistor portion 102, are connected with the M2 interconnect 52 that supplies the output control signal INP through vias. The M1 interconnects 43, placed in the n-type output transistor portion 101, are connected with the M2 interconnects 56a to 56d that supply the power supply voltage VSS through vias. The M1 interconnects 44, placed in the p-type output transistor portion 102, are connected with the M2 interconnects 57a to 57d that supply the power supply voltage VDDIO through vias.

The M1 interconnects 45 are formed across the n-type output transistor portion 101 and the p-type output transistor portion 102. The M1 interconnects 45 are placed in groups of two to extend above the pairs of the groups gn1 to gn8 of VNWs V1 and the groups gp1 to gp8 of VNWs V2 that are respectively opposed in the Y direction. The M1 interconnects 45 are connected with the tops of the VNWs V1 through the local interconnects 31 and with the tops of the VNWs V2 through the local interconnects 32, and also connected with the M2 interconnect 53 that outputs the output signal OUT through vias.

With the layout structure as described above, the tops of the 128 VNWs V formed in the n-type output transistor portion 101 are connected with the M2 interconnect 53 that outputs the output signal OUT through the local interconnects 31 and the M1 interconnects 45. The bottoms thereof are connected with the M2 interconnects 56a to 56d that supply the power supply voltage VSS through the bottom region 11, the vias 27b, and the M1 interconnects 43. The gates thereof are connected with the M2 interconnect 51 that supplies the output control signal INN through the gate interconnects 21, 22, and 23, the vias 27a, and the M1 interconnects 41. Thus, the transistor N1 in the circuit diagram of FIG. 3 is implemented by the 128 VNWs V1 formed in the n-type output transistor portion 101.

Also, the tops of the 128 VNWs V2 formed in the p-type output transistor portion 102 are connected with the M2 interconnect 53 that outputs the output signal OUT through the local interconnects 32 and the M1 interconnects 45. The bottoms thereof are connected with the M2 interconnects 57a to 57d that supply the power supply voltage VDDIO through the bottom region 12, the vias 28b, and the M1 interconnects 44. The gates thereof are connected with the M2 interconnect 52 that supplies the output control signal INP through the gate interconnects 24, 25, and 26, the vias 28a, and the M1 interconnects 42. Thus, the transistor P1 in the circuit diagram of FIG. 3 is implemented by the 128 VNWs V2 formed in the p-type output transistor portion 102.

According to this embodiment, therefore, an output circuit that passes a large current through an output pad can be configured using VNW FETs.

In the configuration described above, the gate interconnects 21 to 26 are formed to extend in the X direction and have the same interconnect width. The local interconnects 31 and 32 are formed to extend in the X direction and have the same interconnect width. The M1 interconnects 41 to 45 are formed to extend in the Y direction and have the same interconnect width. With the direction and width of the interconnects being the same in each interconnect layer as described above, the fabrication becomes easy and the fabrication precision improves. Note that, although the gate interconnects 21 to 26, the local interconnects 31 and 32, and the M1 interconnects 41 to 45 appear to have the same width in the illustrated configuration, it is unnecessary to ensure the same interconnect width over the different interconnect layers. If only the direction and width of interconnects are the same in one interconnect layer, the fabrication will be easy and the fabrication precision will improve.

In the configuration described above, in the n-type output transistor portion 101, the M1 interconnects 45 connected with the tops of the VNWs V1 occupy a larger area than the M1 interconnects 43 as viewed from top. Also, in the p-type output transistor portion 102, the M1 interconnects 45 connected with the tops of the VNWs V2 occupy a larger area than the M1 interconnects 44 as viewed from top. Therefore, the resistance value generated up to the M2 interconnect 53 that outputs the output signal OUT can be reduced. Also, by connecting the M2 interconnect 53 with the tops of the VNWs V1 and V2, the resistance value generated up to the output signal line is reduced compared with the case of connecting the M2 interconnect 53 with the bottoms of the VNWs V1 and V2.

In the configuration described above, for each VNW V1, the supply of the output control signal INN to the gate and the supply of the power supply voltage VSS to the bottom are done from the opposite sides of the VNW V1 in the X direction. For example, in each VNW V1 of the group gn1, the output control signal INN is supplied to the gate from the left as viewed from the figure through the via 27a, and the power supply voltage VSS is supplied to the bottom from the right as viewed from the figure through the via 27b. Likewise, for each VNW V2, the supply of the output control signal INP to the gate and the supply of the power supply voltage VDDIO to the bottom are done from the opposite sides of the VNW V2 in the X direction. For example, in each VNW V2 of the group gp1, the output control signal INP is supplied to the gate from the left as viewed from the figure through the via 28a, and the power supply voltage VDDIO is supplied to the bottom from the right as viewed from the figure through the via 28b. Having such a configuration, the size in the Y direction can be reduced, whereby area reduction can be achieved.

The vias 27a for supplying the output control signal INN may be placed in two or more columns lying side by side. Likewise, the vias 28a for supplying the output control signal INP may be placed in two or more columns lying side by side. Also, the vias 27b for supplying the power supply voltage VSS to the bottom region 11 may be placed in two or more columns lying side by side. Likewise, the vias 28b for supplying the power supply voltage VDDIO to the bottom region 12 may be placed in two or more columns lying side by side.

In the embodiment described above, the bottom region 11 is formed integrally over the n-type output transistor portion 101, and the bottom region 12 is formed integrally over the p-type output transistor portion 102. Alternatively, the bottom regions 11 and 12 may be formed in separate forms. For example, the bottom region 11 may be divided to form individual bottom regions for the groups gn1 to gn8. Note however that stabilization of power supply can be brought about by integrally forming the bottom regions 11 and 12.

Second Embodiment

In the second embodiment, another example of the layout structure of two transistors P1 and N1 constituting the output circuit of FIG. 3 will be described. It is herein assumed that, taking the IO cell 10B shown in FIG. 2B as an example, the n-type output transistor portion 103 constitutes the transistor N1 and the p-type output transistor portion 104 constitutes the transistor P1.

Figure 10:
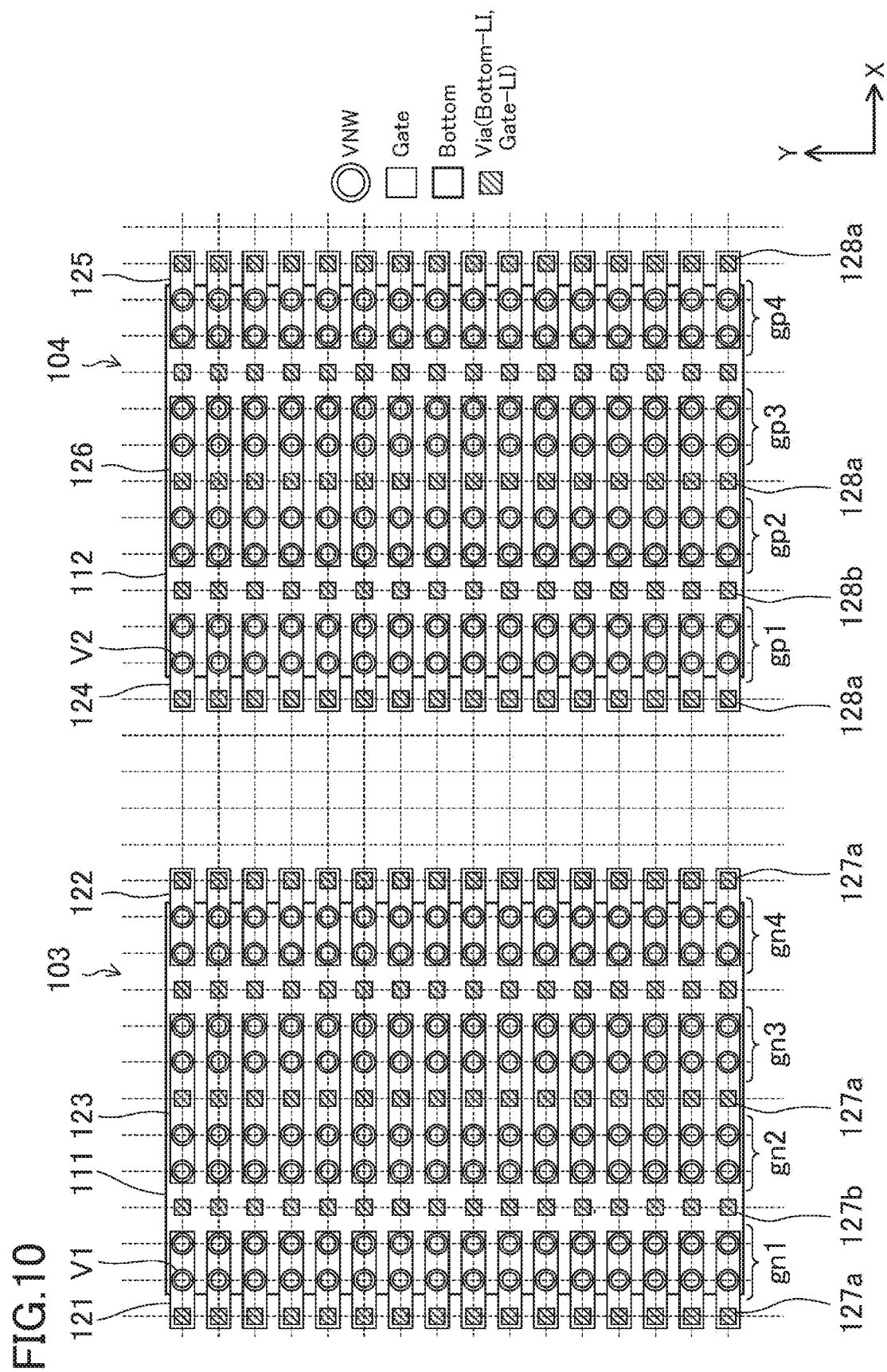
FIG. 10 is a layer-by-layer plan view showing an example of a layout structure according to the second embodiment.
Figure 11:
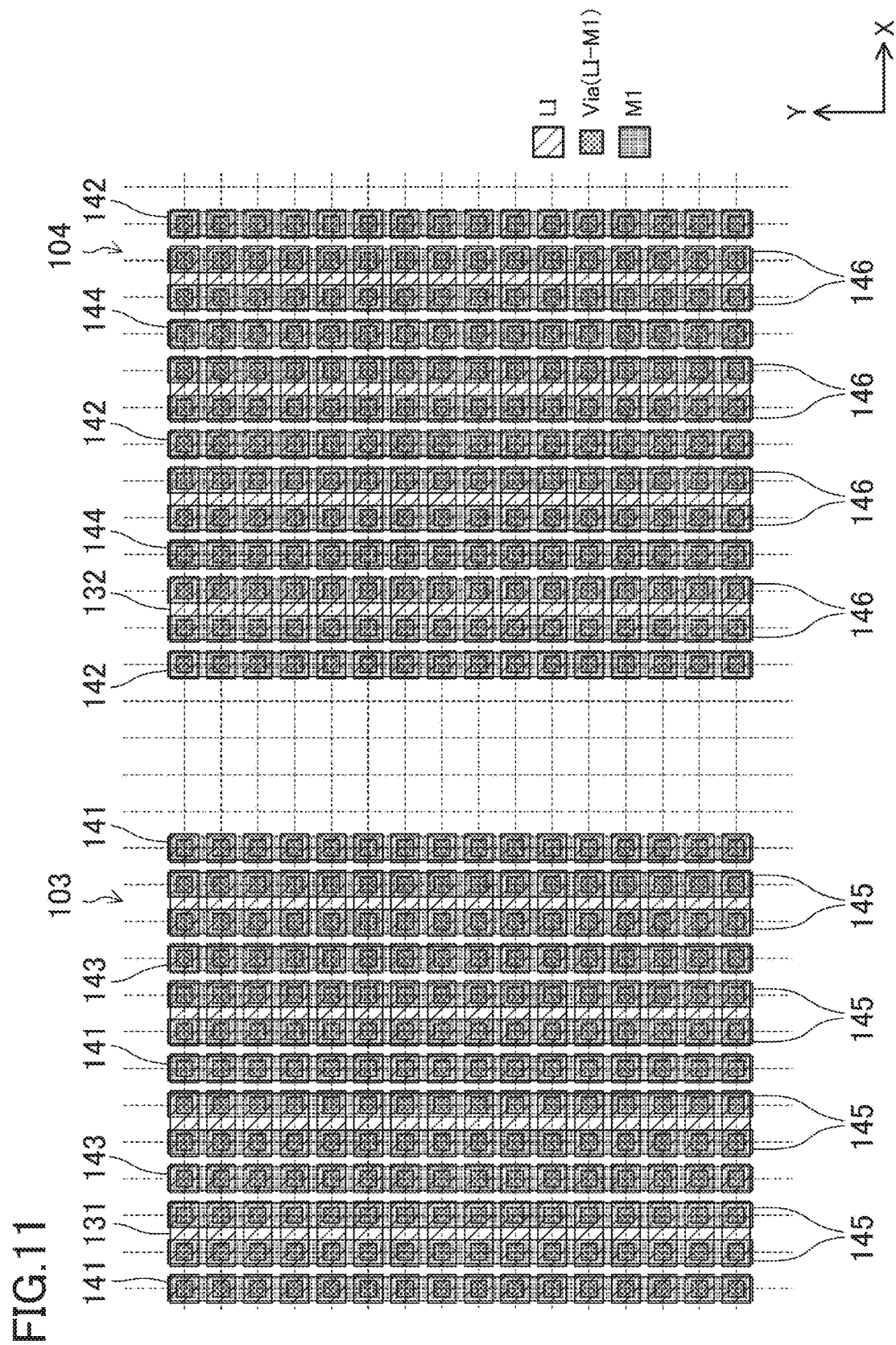
FIG. 11 is a layer-by-layer plan view showing the layout structure according to the second embodiment.
Figure 12:
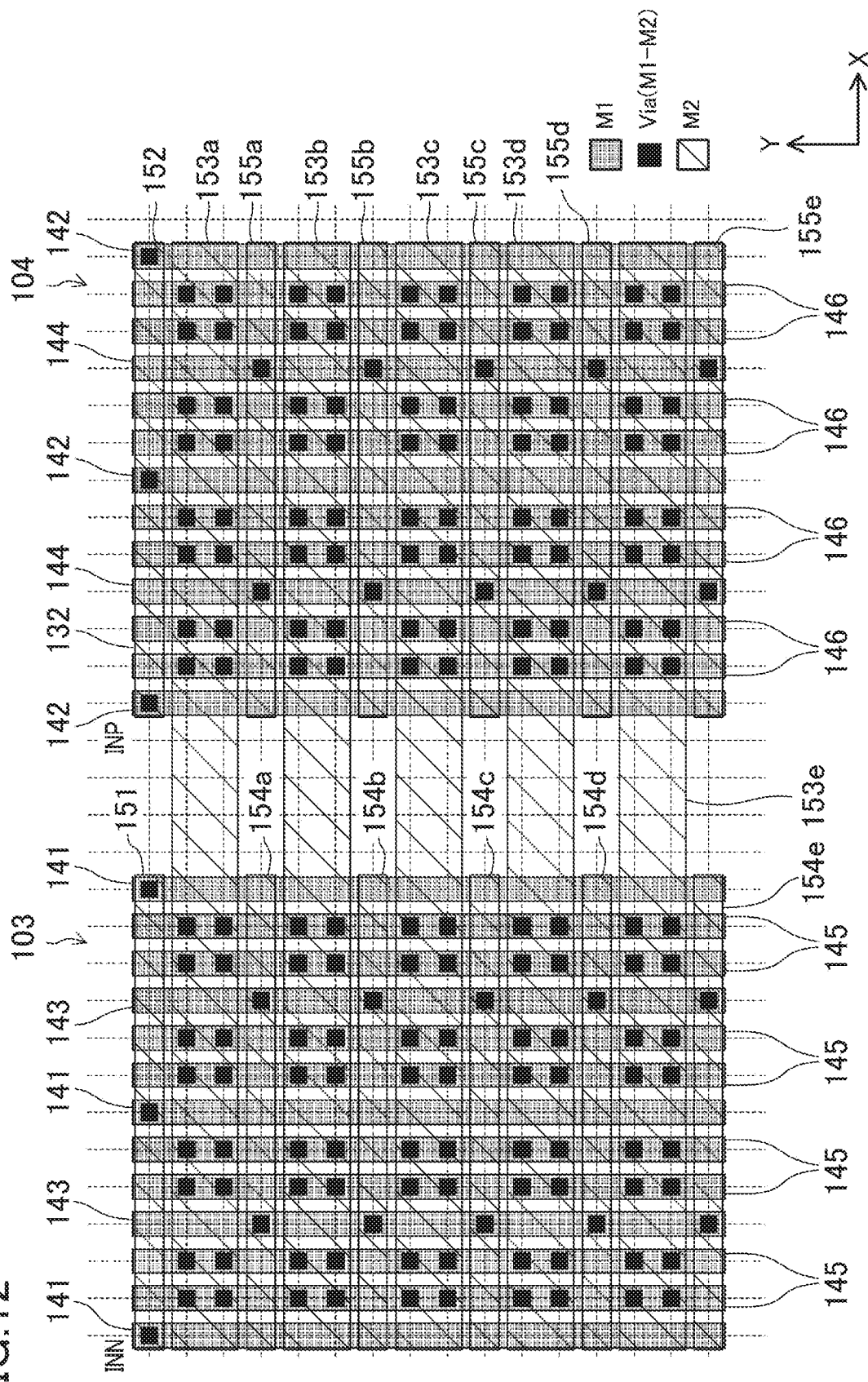
FIG. 12 is a layer-by-layer plan view showing the layout structure according to the second embodiment.
Figure 13:
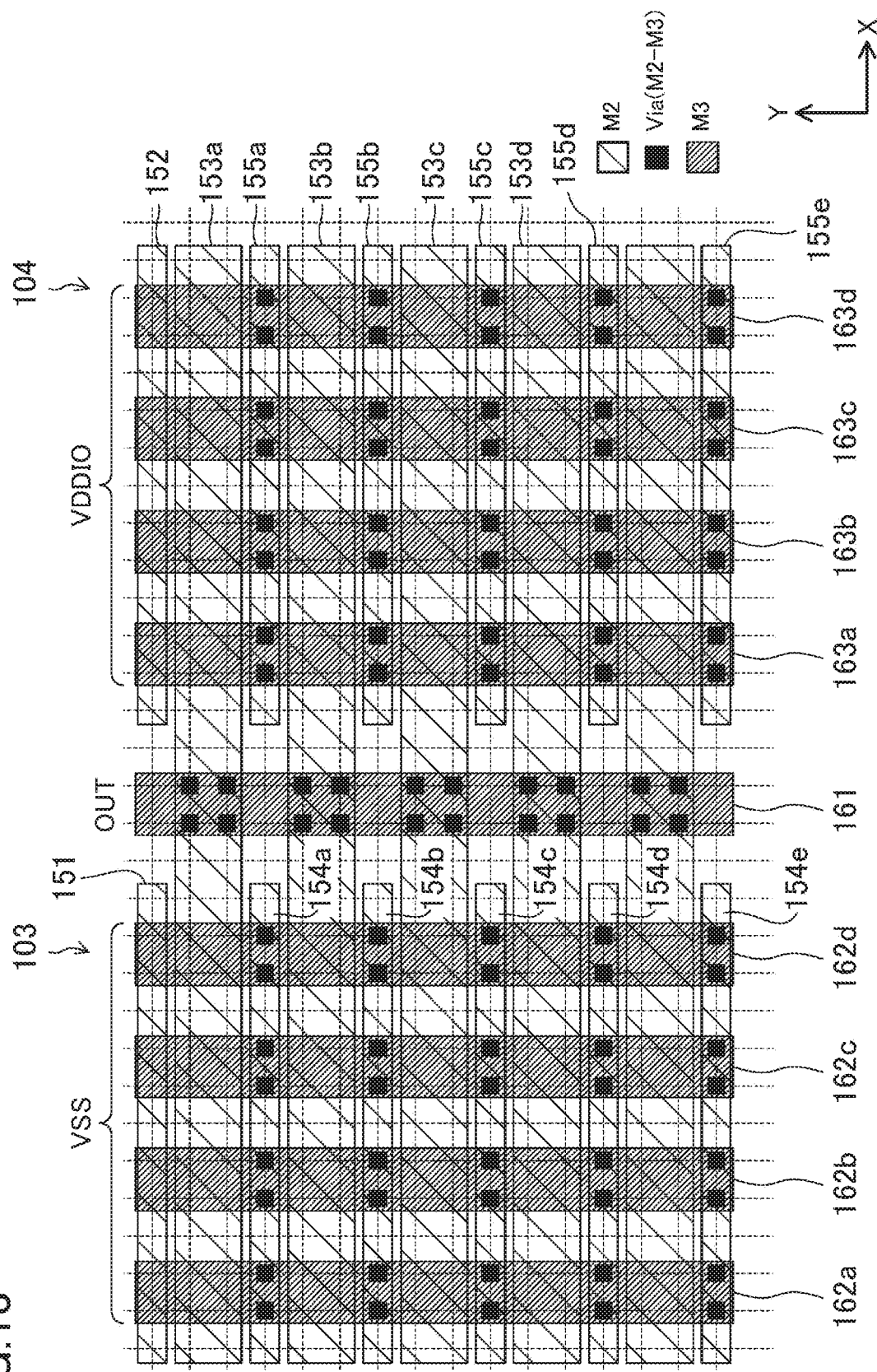
FIG. 13 is a layer-by-layer plan view showing the layout structure according to the second embodiment.

FIGS. 10 to 13 are layer-to-layer plan views showing an example of the layout structure of the transistors P1 and N1 according to this embodiment. Specifically, FIG. 10 shows VNW FETs and layers below them, FIG. 11 shows local interconnects and M1 interconnects above the VNW FETs, FIG. 12 shows M1 and M2 interconnects, and FIG. 13 shows M2 and M3 interconnects. Note that an overall plan view and cross-sectional views are omitted here because they can be easily drawn by analogy from the first embodiment.

In the plan views such as FIG. 10, the left part of the figure corresponds to the n-type output transistor portion 103 and implements the transistor N1 in the circuit of FIG. 3. The right part of the figure corresponds to the p-type output transistor portion 104 and implements the transistor P1 in the circuit of FIG. 3.

As shown in FIG. 10, in the n-type output transistor portion 103, a total of 128 n-type VNWs V1 are formed in an array of 8 columns in the X direction and 16 rows in the Y direction. The transistor N1 is implemented by these 128 n-type VNWs V1. In the n-type output transistor portion 103, a bottom region 111 is formed almost over the entire surface, and the bottoms of the 128 VNWs V1 are connected to the bottom region 111.

The VNWs V1 are placed with spacing provided every two columns in the X direction. Groups of such two columns of VNWs V1 are herein denoted by gn1 to gn4. In each of the groups gn1 to gn4, the gates of VNWs V1 adjacent in the X direction are mutually connected. Gate interconnects 121 are drawn from the group gn1 leftward as viewed from the figure, and gate interconnects 122 are drawn from the group gn4 rightward as viewed from the figure. In the groups gn2 and gn3, four VNWs V1 adjacent in the X direction are connected with one another through a gate interconnect 123. That is, such gate interconnects 123 are gate interconnects drawn from the group gn2 rightward and also gate interconnects drawn from the group gn3 leftward as viewed from the figure.

Vias 127a for connection with local interconnects in an upper layer are formed on the gate interconnects 121, 122, and 123. Also, vias 127b for connection with local interconnects in the upper layer are formed on the bottom region 111 to line up in the Y direction between the groups gn1 and gn2 and between the groups gn3 and gn4.

Likewise, in the p-type output transistor portion 104, a total of 128 p-type VNWs V2 are formed in an array of 8 columns in the X direction and 16 rows in the Y direction. The transistor P1 is implemented by these 128 p-type VNWs V2. In the p-type output transistor portion 104, a bottom region 112 is formed almost over the entire surface, and the bottoms of the 128 VNWs V2 are connected to the bottom region 112.

The VNWs V2 are placed with spacing provided every two columns in the X direction. Groups of such two columns of VNWs V2 are herein denoted by gp1 to gp4. In each of the groups gp1 to gp4, the gates of VNWs V2 adjacent in the X direction are mutually connected. Gate interconnects 124 are drawn from the group gp1 leftward as viewed from the figure, and gate interconnects 125 are drawn from the group gp4 rightward as viewed from the figure. In the groups gp2 and gp3, four VNWs V2 adjacent in the X direction are connected with one another through a gate interconnect 126. That is, such gate interconnects 126 are gate interconnects drawn from the group gp2 rightward and also gate interconnects drawn from the group gp3 leftward as viewed from the figure.

Vias 128a for connection with local interconnects in an upper layer are formed on the gate interconnects 124, 125, and 126. Also, vias 128b for connection with local interconnects in the upper layer are formed on the bottom region 112 to line up in the Y direction between the groups gp1 and gp2 and between the groups gp3 and gp4.

As shown in FIG. 11, in each of the groups gn1 to gn4, the tops of VNWs V1 adjacent in the X direction are mutually connected through a local interconnect 131. Likewise, in each of the groups gp1 to gp4, the tops of VNWs V2 adjacent in the X direction are mutually connected through a local interconnect 132.

As shown in FIG. 13, in an M3 interconnect layer, M3 interconnects 161, 162a to 162d, and 163a to 163d extend in the Y direction. The M3 interconnect 161 outputs the output signal OUT and corresponds to the output signal line according to the present disclosure. The M3 interconnects 162a to 162d are interconnects that supply the power supply voltage VSS and correspond to the power supply interconnect 7. The M3 interconnects 163a to 163d are interconnects that supply the power supply voltage VDDIO and correspond to the power supply interconnect 6.

As shown in FIGS. 12 and 13, in an M2 interconnect layer, M2 interconnects 151, 152, 153a to 153e, 154a to 154e, and 155a to 155e extend in the X direction. The M2 interconnect 151 supplies the output control signal INN. The M2 interconnect 152 supplies the output control signal INP. The M2 interconnects 153a to 153e are connected with the M3 interconnect 161 that outputs the output signal OUT through vias. The M2 interconnects 154a to 154e are connected with the M3 interconnects 162a to 162d that supply the power supply voltage VSS through vias. The M2 interconnects 155a to 155e are connected with the M3 interconnects 163a to 163d that supply the power supply voltage VDDIO through vias.

As shown in FIGS. 11 and 12, in an M1 interconnect layer, M1 interconnects 141, 142, 143, 144, 145, and 146 extend in the Y direction. The M1 interconnects 141, placed in the n-type output transistor portion 103, are connected with the M2 interconnect 151 that supplies the output control signal INN through vias. Likewise, the M1 interconnects 142, placed in the p-type output transistor portion 104, are connected with the M2 interconnect 152 that supplies the output control signal INP through vias. The M1 interconnects 143, placed in the n-type output transistor portion 103, are connected with the M2 interconnects 154a to 154e through vias. The M1 interconnects 144, placed in the p-type output transistor portion 104, are connected with the M2 interconnects 155a to 155e through vias.

The M1 interconnects 145 are placed, in the n-type output transistor portion 103, in groups of two to extend above the groups gn1 to gn4 of VNWs V1. The M1 interconnects 145 are connected with the tops of the VNWs V1 through the local interconnects 131 and also connected with the M2 interconnects 153a to 153e through vias. Likewise, the M1 interconnects 146 are placed, in the p-type output transistor portion 104, in groups of two to extend above the groups gp1 to gp4 of VNWs V2. The M1 interconnects 146 are connected with the tops of the VNWs V2 through the local interconnects 132 and also connected with the M2 interconnects 153a to 153e through vias.

With the layout structure as described above, the tops of the 128 VNWs V1 formed in the n-type output transistor portion 103 are connected with the M3 interconnect 161 that outputs the output signal OUT through the local interconnects 131, the M1 interconnects 145, and the M2 interconnects 153a to 153e. The bottoms thereof are connected with the M3 interconnects 162a to 162d that supply the power supply voltage VSS through the bottom region 111, the vias 127b, the M1 interconnects 143, and the M2 interconnects 154a to 154e. The gates thereof are connected with the M2 interconnect 151 that supplies the output control signal INN through the gate interconnects 121, 122, and 123, the vias 127a, and the M1 interconnects 141. Thus, the transistor N1 in the circuit diagram of FIG. 3 is implemented by the 128 VNWs V1 formed in the n-type output transistor portion 103.

Also, the tops of the 128 VNWs V2 formed in the p-type output transistor portion 104 are connected with the M3 interconnect 161 that outputs the output signal OUT through the local interconnects 132, the M1 interconnects 146, and the M2 interconnects 153a to 153e. The bottoms thereof are connected with the M3 interconnects 163a to 163d that supply the power supply voltage VDDIO through the bottom region 112, the vias 128b, the M1 interconnects 144, and the M2 interconnects 155a to 155e. The gates thereof are connected with the M2 interconnect 152 that supplies the output control signal INP through the gate interconnects 124, 125, and 126, the vias 128a, and the M interconnects 142. Thus, the transistor P1 in the circuit diagram of FIG. 3 is implemented by the 128 VNWs V2 formed in the p-type output transistor portion 104.

According to this embodiment, therefore, an output circuit that passes a large current through an output pad can be configured using VNW FETs.

In the configuration described above, the gate interconnects 121 to 126 are formed to extend in the X direction and have the same interconnect width. The local interconnects 131 and 132 are formed to extend in the X direction and have the same interconnect width. The M1 interconnects 141 to 146 are formed to extend in the Y direction and have the same interconnect width. With the direction and width of the interconnects being the same in each interconnect layer as described above, the fabrication becomes easy and the fabrication precision improves. Note that, although the gate interconnects 121 to 126, the local interconnects 131 and 132, and the M1 interconnects 141 to 146 appear to have the same width in the illustrated configuration, it is unnecessary to ensure the same interconnect width over the different interconnect layers. If only the direction and width of interconnects are the same in one interconnect layer, the fabrication will be easy and the fabrication precision will improve.

In the configuration described above, in the n-type output transistor portion 103, the M1 interconnects 145 connected with the tops of the VNWs V1 occupy a larger area than the M1 interconnects 143 as viewed from top. Also, in the p-type output transistor portion 104, the M1 interconnects 146 connected with the tops of the VNWs V2 occupy a larger area than the M1 interconnects 144 as viewed from top. Therefore, the resistance value generated up to the M3 interconnect 161 that outputs the output signal OUT can be reduced. Also, by connecting the M3 interconnect 161 with the tops of the VNWs V1 and V2, the resistance value generated up to the output signal line is reduced compared with the case of connecting the M3 interconnect 161 with the bottoms of the VNWs V1 and V2.

In the configuration described above, for each VNW V1, the supply of the output control signal INN to the gate and the supply of the power supply voltage VSS to the bottom are done from the opposite sides of the VNW V1 in the X direction. For example, in each VNW V1 of the group gn1, the output control signal INN is supplied to the gate from the left as viewed from the figure through the via 127a and the power supply voltage VSS is supplied to the bottom from the right as viewed from the figure through the via 127b. Likewise, for each VNW V2, the supply of the output control signal INP to the gate and the supply of the power supply voltage VDDIO to the bottom are done from the opposite sides of the VNW V2 in the X direction. For example, in each VNW V2 of the group gp1, the output control signal INP is supplied to the gate from the left as viewed from the figure through the via 128a and the power supply voltage VDDIO is supplied to the bottom from the right as viewed from the figure through the via 128b. Having such a configuration, the size in the Y direction can be reduced, whereby area reduction can be achieved.

The vias 127a for supplying the output control signal INN may be placed in two or more columns lying side by side. Likewise, the vias 128a for supplying the output control signal INP may be placed in two or more columns lying side by side. Also, the vias 127b for supplying the power supply voltage VSS to the bottom region 111 may be placed in two or more columns lying side by side. Likewise, the vias 128b for supplying the power supply voltage VDDIO to the bottom region 112 may be placed in two or more columns lying side by side.

In the embodiment described above, the bottom region 111 is formed integrally over the n-type output transistor portion 103, and the bottom region 112 is formed integrally over the p-type output transistor portion 104. Alternatively, the bottom regions 111 and 112 may be formed in separate forms. For example, the bottom region 111 may be divided to form individual bottom regions for the groups gn1 to gn4. Note however that stabilization of power supply can be brought about by integrally forming the bottom regions 111 and 112.

Third Embodiment

Figure 14:
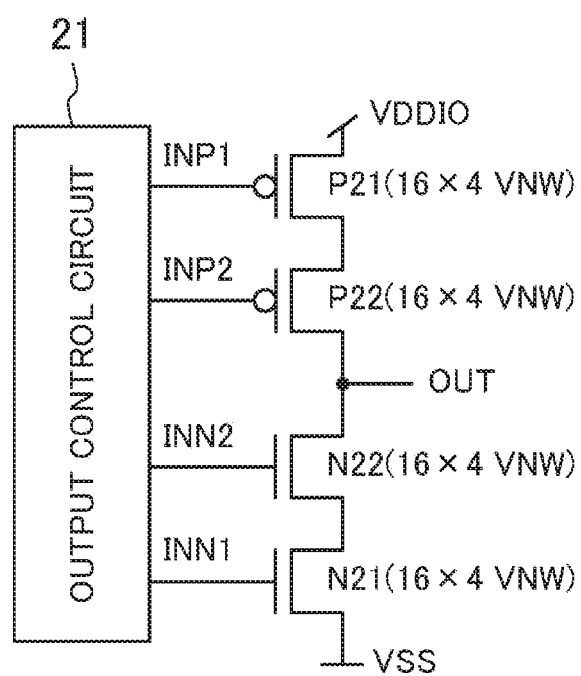
FIG. 14 is a circuit diagram of an output circuit in the third and fourth embodiments.

FIG. 14 is a circuit diagram of an output circuit in this embodiment. In the output circuit of FIG. 14, p-type transistors P21 and P22 are provided in series between the power supply VDDIO and an output signal line, and n-type transistors N21 and N22 are provided in series between the power supply VSS and the output signal line. An output control circuit 21 outputs output control signals INP1, INP2, INN1, and INN2. The transistor P21 receives the output control signal INP1 at its gate, and the transistor P22 receives the output control signal INP2 at its gate. The transistor N21 receives the output control signal INN1 at its gate, and the transistor N22 receives the output control signal INN2 at its gate. An output signal OUT is supplied to an external connection pad. The output signal OUT is high (VDDIO) when the output control signals INP1, INP2, INN1, and INN2 are low, and is low (VSS) when they are high. Note that one of the output control signals INP1 and INP2 may have a fixed potential (VSS), and one of the output control signals INN1 and INN2 may have a fixed potential (VDDIO).

Hereinafter, the layout structures of the four transistors P21, P22, N21, and N22 constituting the output circuit of FIG. 14 will be described. It is herein assumed that, taking the IO cell 10A shown in FIG. 2A as an example, the transistors N21 and N22 are constituted by the n-type output transistor portion 101 and the transistor P21 and P22 are constituted by the p-type output transistor portion 102.

Figure 15:
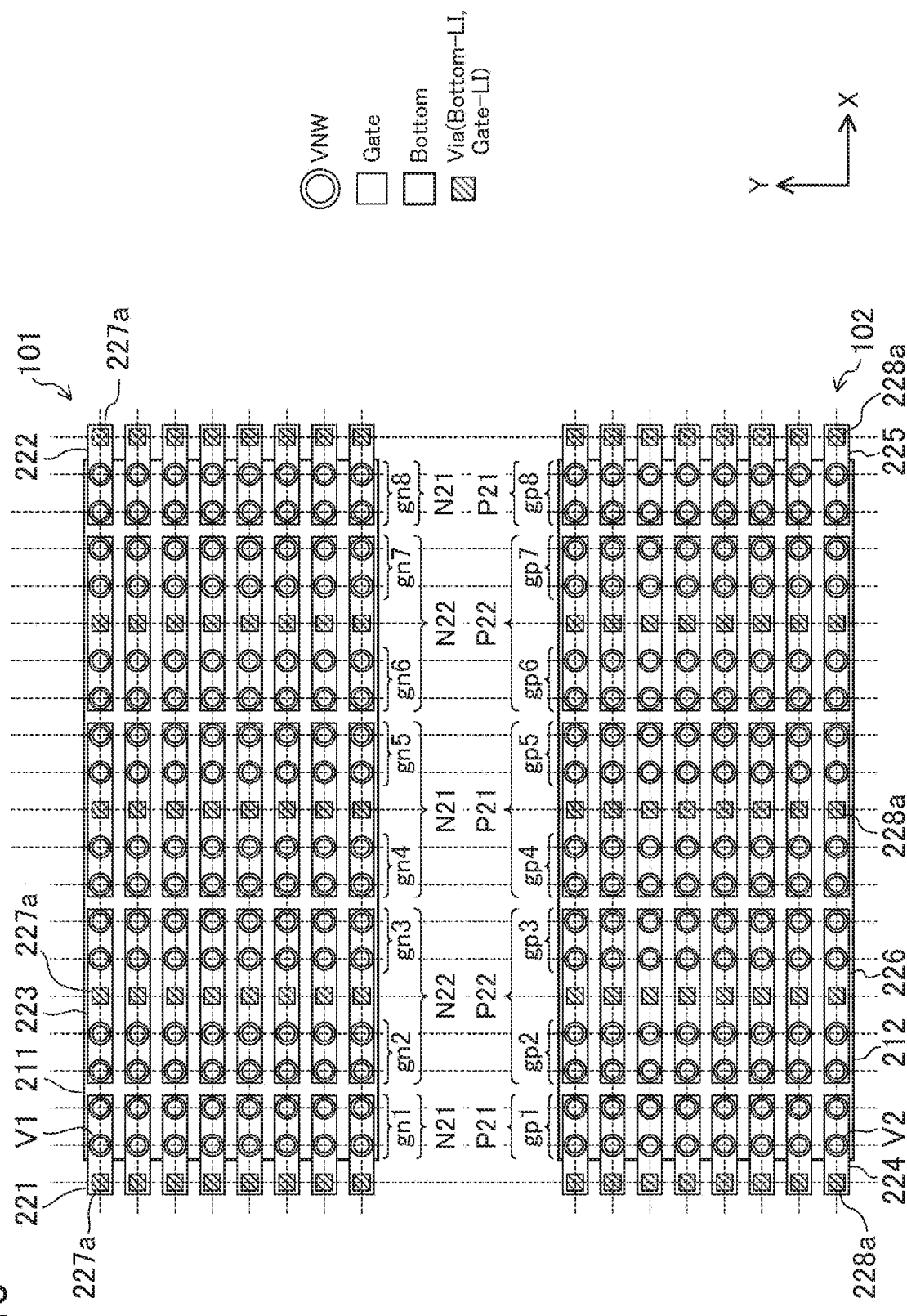
FIG. 15 is a layer-by-layer plan view showing an example of a layout structure according to the third embodiment.
Figure 16:
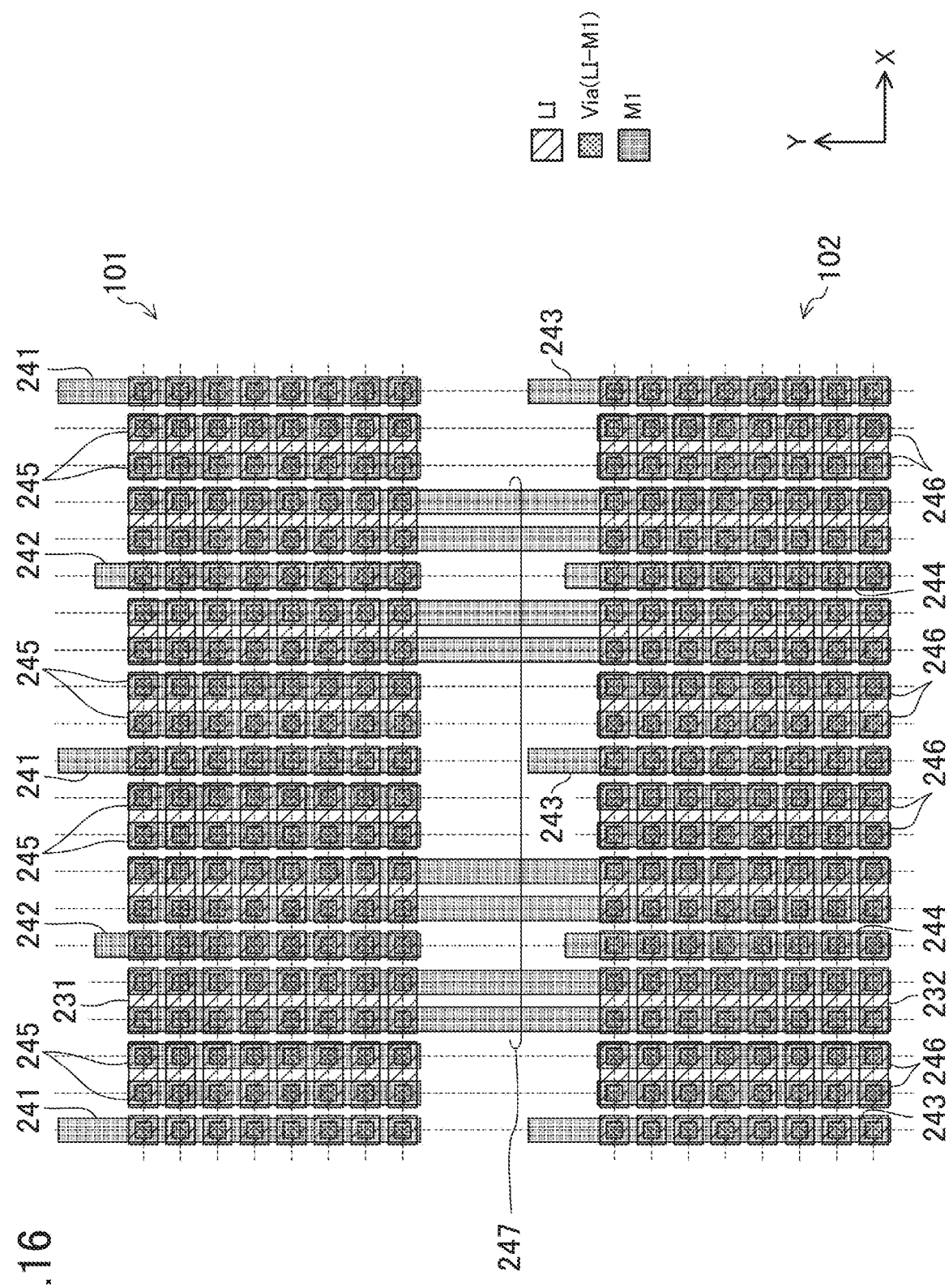
FIG. 16 is a layer-by-layer plan view showing the layout structure according to the third embodiment.
Figure 17:
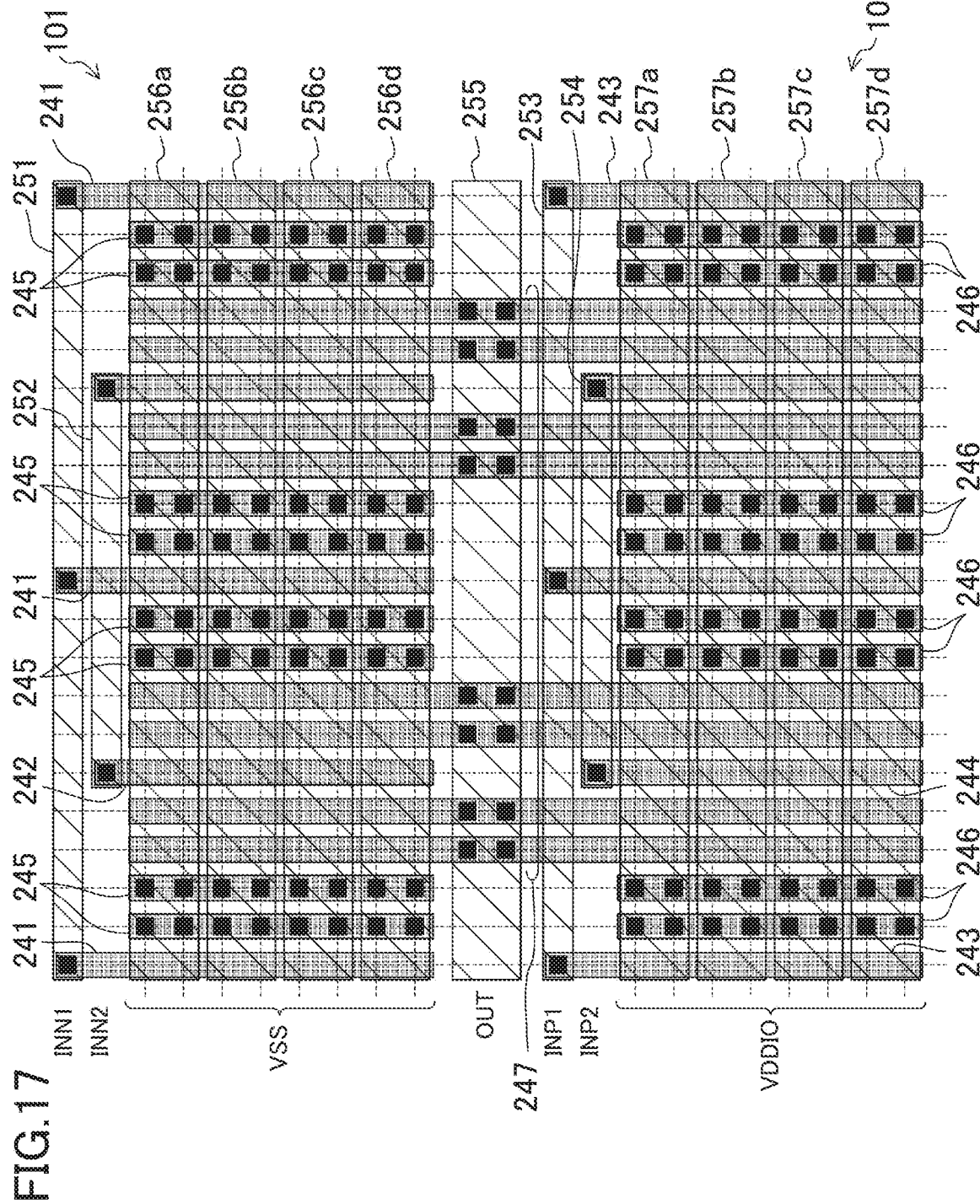
FIG. 17 is a layer-by-layer plan view showing the layout structure according to the third embodiment.

FIGS. 15 to 17 are layer-to-layer plan views showing an example of the layout structure of the transistors P21, P22, N21, and N22 according to this embodiment. Specifically, FIG. 15 shows VNW FETs and layers below them, FIG. 16 shows local interconnects and M1 interconnects above the VNW FETs, and FIG. 17 shows M1 and M2 interconnects. Note that an overall plan view and cross-sectional views are omitted here because they can be easily drawn by analogy from the first embodiment.

In the plan views such as FIG. 15, the upper part of the figure corresponds to the n-type output transistor portion 101 and implements the transistors N21 and N22 in the circuit of FIG. 14. The lower part of the figure corresponds to the p-type output transistor portion 102 and implements the transistors P21 and P22 in the circuit of FIG. 14.

As shown in FIG. 15, in the n-type output transistor portion 101, a total of 128 n-type VNWs V1 are formed in an array of 16 columns in the X direction and 8 rows in the Y direction. In the n-type output transistor portion 101, a bottom region 211 is formed almost over the entire surface, and the bottoms of the 128 VNWs V1 are connected to the bottom region 211.

The VNWs V1 are placed in groups of two columns in the X direction. These groups of two columns of VNWs V1 are herein denoted by gn1 to gn8. As will be described later, the transistor N21 is implemented by 64 VNWs V1 belonging to the groups gn1, gn4, gn5, and gn8. Also, the transistor N22 is implemented by 64 VNWs V1 belonging to the groups gn2, gn3, gn6, and gn7. Spacing is provided between the groups gn2 and gn3, between the groups gn4 and gn5, and between the groups gn6 and gn7.

In each of the groups gn1 to gn8, the gates of VNWs V1 adjacent in the X direction are mutually connected. Gate interconnects 221 are drawn from the group gn1 leftward as viewed from the figure, and gate interconnects 222 are drawn from the group gn8 rightward as viewed from the figure. In the groups gn2 and gn3, four VNWs V1 adjacent in the X direction are connected with one another through a gate interconnect 223. That is, such gate interconnects 223 are gate interconnects drawn from the group gn2 rightward and also gate interconnects drawn from the group gn3 leftward as viewed from the figure. Likewise, in the groups gn4 and gn5, four VNWs V1 adjacent in the X direction are connected with one another through a gate interconnect 223, and in the groups gn6 and gn7, four VNWs V1 adjacent in the X direction are connected with one another through a gate interconnect 223.

Vias 227a for connection with local interconnects in an upper layer are formed on the gate interconnects 221, 222, and 223.

Likewise, in the p-type output transistor portion 102, a total of 128 p-type VNWs V2 are formed in an array of 16 columns in the X direction and 8 rows in the Y direction. In the p-type output transistor portion 102, a bottom region 212 is formed almost over the entire surface, and the bottoms of the 128 VNWs V2 are connected to the bottom region 212.

The VNWs V2 are placed in groups of two columns in the X direction. These groups of two columns of VNWs V2 are herein denoted by gp1 to gp8. The transistor P21 is implemented by 64 VNWs V2 belonging to the groups gp1, gp4, gp5, and gp8. Also, the transistor P22 is implemented by 64 VNWs V2 belonging to the groups gp2, gp3, gp6, and gp7. Spacing is provided between the groups gp2 and gp3, between the groups gp4 and gp5, and between the groups gp6 and gp7.

In each of the groups gp1 to gp8, the gates of VNWs V2 adjacent in the X direction are mutually connected. Gate interconnects 224 are drawn from the group gp1 leftward as viewed from the figure, and gate interconnects 225 are drawn from the group gp8 rightward as viewed from the figure. In the groups gp2 and gp3, four VNWs V2 adjacent in the X direction are connected with one another through a gate interconnect 226. That is, such gate interconnects 226 are gate interconnects drawn from the group gp2 rightward and also gate interconnects drawn from the group gp3 leftward as viewed from the figure. Likewise, in the groups gp4 and gp5, four VNWs V2 adjacent in the X direction are connected with one another through a gate interconnect 226, and in the groups gp6 and gp7, four VNWs V2 adjacent in the X direction are connected with one another through a gate interconnect 226.

Vias 228a for connection with local interconnects in an upper layer are formed on the gate interconnects 224, 225, and 226.

As shown in FIG. 16, in each of the groups gn1 to gn8, the tops of VNWs V1 adjacent in the X direction are mutually connected through a local interconnect 231. Likewise, in each of the groups gp1 to gp8, the tops of VNWs V2 adjacent in the X direction are mutually connected through a local interconnect 232.

As shown in FIG. 17, in an M2 interconnect layer, M2 interconnects 251, 252, 253, 254, 255, 256a to 256d, and 257a to 257d extend in the X direction. The M2 interconnect 251 supplies the output control signal INN1. The M2 interconnect 252 supplies the output control signal INN2. The M2 interconnect 253 supplies the output control signal INP1. The M2 interconnect 254 supplies the output control signal INP2. The M2 interconnect 255 is a signal line that outputs the output signal OUT and corresponds to the output signal line according to the present disclosure. The M2 interconnects 256a to 256d are interconnects that supply the power supply voltage VSS and correspond to the power supply interconnect 7. The M2 interconnects 257a to 257d are interconnects that supply the power supply voltage VDDIO and correspond to the power supply interconnect 6.

As shown in FIGS. 16 and 17, in an M interconnect layer, M interconnects 241, 242, 243, 244, 245, 246, and 247 extend in the Y direction. The M1 interconnects 241, placed in the n-type output transistor portion 101, are connected with the M2 interconnect 251 that supplies the output control signal INN1 through vias. The M1 interconnects 242, placed in the n-type output transistor portion 101, are connected with the M2 interconnect 252 that supplies the output control signal INN2 through vias. The M1 interconnects 243, placed in the p-type output transistor portion 102, are connected with the M2 interconnect 253 that supplies the output control signal INP1 through vias. The M1 interconnects 244, placed in the p-type output transistor portion 102, are connected with the M2 interconnect 254 that supplies the output control signal INP2 through vias.

The M1 interconnects 245 are placed, in the n-type output transistor portion 101, in groups of two to extend above the groups gn1, gn4, gn5, and gn8 of VNWs V1 constituting the transistor N21. The M1 interconnects 245 are connected with the tops of the VNWs V1 of the groups gn1, gn4, gn5, and gn8 through the local interconnects 231 and also connected with the M2 interconnects 256a to 256d that supply the power supply voltage VSS through vias.

The M1 interconnects 246 are placed, in the p-type output transistor portion 102, in groups of two to extend above the groups gp1, gp4, gp5, and gp8 of VNWs V2 constituting the transistor P21. The M1 interconnects 246 are connected with the tops of the VNWs V2 of the groups gp1, gp4, gp5, and gp8 through the local interconnects 232 and also connected with the M2 interconnects 257a to 257d that supply the power supply voltage VDDIO through vias.

The M1 interconnects 247 are formed across the n-type output transistor portion 101 and the p-type output transistor portion 102. The M1 interconnects 247 are placed in groups of two to extend above the pairs of the groups gn2, gn3, gn6, and gn7 of VNWs V1 constituting the transistor N22 and the groups gp2, gp3, gp6, and gp7 of VNWs V2 constituting the transistor P22 that are respectively opposed in the Y direction. The M1 interconnects 247 are connected with the tops of the VNWs V1 of the groups gn2, gn3, gn6, and gn7 through the local interconnects 231 and with the tops of the VNWs V2 of the groups gp2, gp3, gp6, and gp7 through the local interconnects 232, and also connected with the M2 interconnect 255 that outputs the output signal OUT through vias.

With the layout structure as described above, the tops of 64 VNWs V1 belonging to the groups gn1, gn4, gn5, and gn8, out of the 128 VNWs V1 formed in the n-type output transistor portion 101, are connected with the M2 interconnects 256a to 256d that supply the power supply voltage VSS through the local interconnects 231 and the M1 interconnects 245. The bottoms thereof are connected with the bottom region 211. The gates thereof are connected with the M2 interconnect 251 that supplies the output control signal INN1 through the gate interconnects 221, 222, and 223, the vias 227a, and the M1 interconnects 241. Also, the tops of 64 VNWs V1 belonging to the groups gn2, gn3, gn6, and gn7, out of the 128 VNWs V1 formed in the n-type output transistor portion 101, are connected with the M2 interconnect 255 that outputs the output signal OUT through the local interconnects 231 and the M1 interconnects 247. The bottoms thereof are connected with the bottoms of 64 VNWs V1 belonging to the groups gn1, gn4, gn5, and gn8 through the bottom region 211. The gates thereof are connected with the M2 interconnect 252 that supplies the output control signal INN2 through the gate interconnects 223, the vias 227a, and the M1 interconnects 242.

Thus, the transistor N21 in the circuit diagram of FIG. 14 is implemented by 64 VNWs V1 belonging to the groups gn1, gn4, gn5, and gn8, out of the 128 VNWs V1 formed in the n-type output transistor portion 101, and the transistor N22 in the circuit diagram of FIG. 14 is implemented by 64 VNWs V1 belonging to the groups gn2, gn3, gn6, and gn7.

Also, the tops of 64 VNWs V2 belonging to the groups gp1, gp4, gp5, and gp8, out of the 128 VNWs V2 formed in the p-type output transistor portion 102, are connected with the M2 interconnects 257a to 257d that supply the power supply voltage VDDIO through the local interconnects 232 and the M interconnects 246. The bottoms thereof are connected with the bottom region 212. The gates thereof are connected with the M2 interconnect 253 that supplies the output control signal INP1 through the gate interconnects 224, 225, and 226, the vias 228a, and the M1 interconnects 243. Also, the tops of 64 VNWs V2 belonging to the groups gp2, gp3, gp6, and gp7, out of the 128 VNWs V2 formed in the p-type output transistor portion 102, are connected with the M2 interconnect 255 that outputs the output signal OUT through the local interconnects 232 and the M1 interconnects 247. The bottoms thereof are connected with the bottoms of 64 VNWs V2 belonging to the groups gp1, gp4, gp5, and gp8 through the bottom region 212. The gates thereof are connected with the M2 interconnect 254 that supplies the output control signal INP2 through the gate interconnects 226, the vias 228a, and the M1 interconnects 244.

Thus, the transistor P21 in the circuit diagram of FIG. 14 is implemented by 64 VNWs V2 belonging to the groups gp1, gp4, gp5, and gp8, out of the 128 VNWs V2 formed in the p-type output transistor portion 102, and the transistor P22 in the circuit diagram of FIG. 14 is implemented by 64 VNWs V2 belonging to the groups gp2, gp3, gp6, and gp7.

According to this embodiment, therefore, an output circuit that passes a large current through an output pad can be configured using VNW FETs.

In the configuration described above, the gate interconnects 221 to 226 are formed to extend in the X direction and have the same interconnect width. The local interconnects 231 and 232 are formed to extend in the X direction and have the same interconnect width. The M1 interconnects 241 to 247 are formed to extend in the Y direction and have the same interconnect width. With the direction and width of the interconnects being the same in each interconnect layer as described above, the fabrication becomes easy and the fabrication precision improves. Note that, although the gate interconnects 221 to 226, the local interconnects 231 and 232, and the M1 interconnects 241 to 247 appear to have the same width in the illustrated configuration, it is unnecessary to ensure the same interconnect width over the different interconnect layers. If only the direction and width of interconnects are the same in one interconnect layer, the fabrication will be easy and the fabrication precision will improve.

In the configuration described above, the M2 interconnect 255 is connected with the tops of the VNWs V1 of the groups gn2, gn3, gn6, and gn7 constituting the transistor N22 and the tops of the VNWs V2 of the groups gp2, gp3, gp6, and gp7 constituting the transistor P22. This reduces the resistance value generated up to the output signal line compared with the case of connecting the M2 interconnect 255 with the bottoms of the VNWs V1 and V2.

The vias 227a for supplying the output control signals INN1 and INN2 may be placed in two or more columns lying side by side. Likewise, the vias 228a for supplying the output control signals INP1 and INP2 may be placed in two or more columns lying side by side.

In the embodiment described above, the bottom region 211 is formed integrally over the n-type output transistor portion 101, and the bottom region 212 is formed integrally over the p-type output transistor portion 102. Alternatively, the bottom regions 211 and 212 may be formed in separate forms. For example, the bottom region 211 may be divided to form individual bottom regions for the groups gn1 and gn2, the groups gn3 and gn4, the groups gn5 and gn6, and the groups gn7 and gn8.

Fourth Embodiment

In the fourth embodiment, another example of the layout structure of four transistors P21, P22, N21, and N22 constituting the output circuit of FIG. 14 will be described. It is herein assumed that, taking the IO cell 10B shown in FIG. 2B as an example, the transistors N21 and N22 are constituted by the n-type output transistor portion 103 and the transistors P21 and P22 are constituted by the p-type output transistor portion 104.

Figure 18:
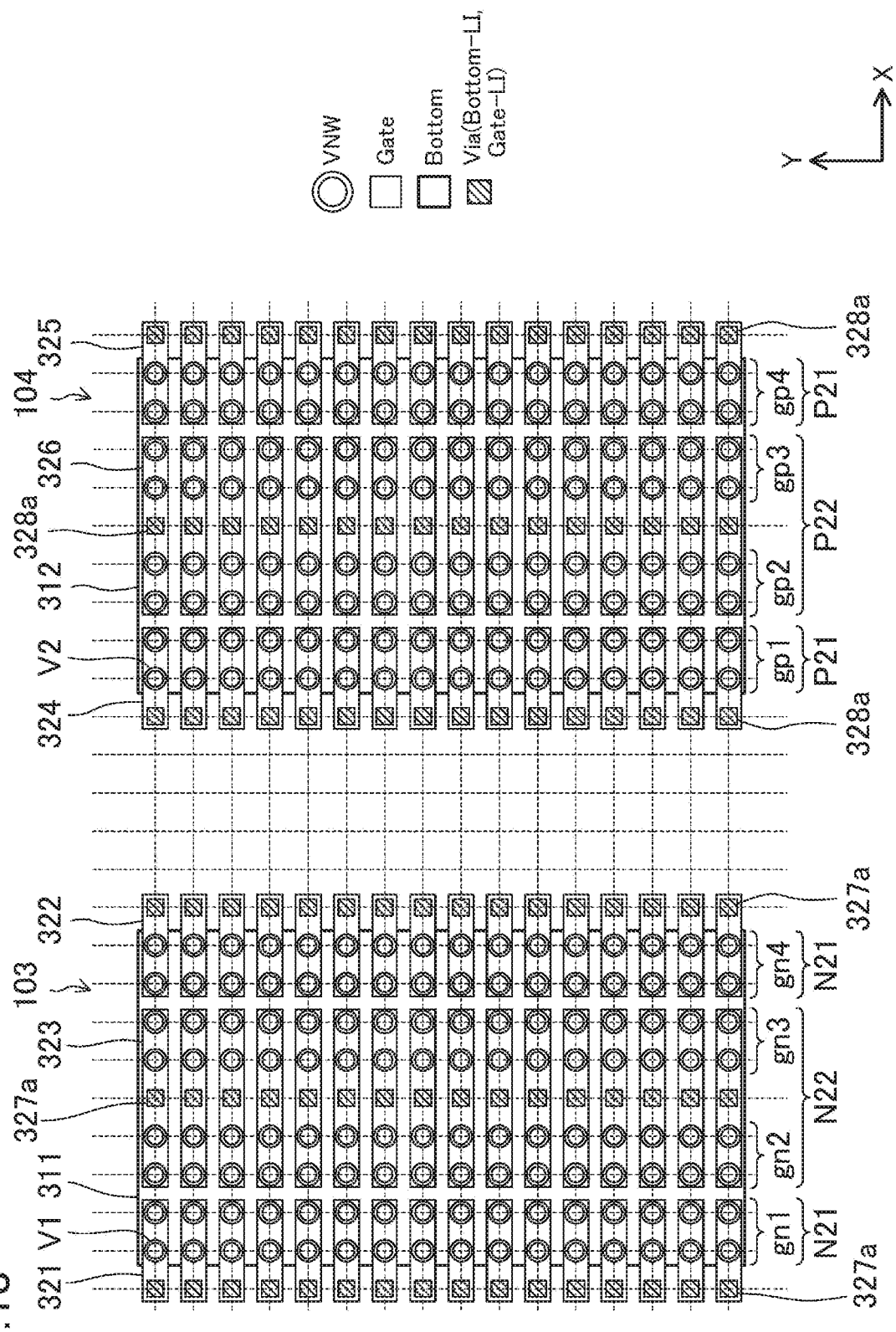
FIG. 18 is a layer-by-layer plan view showing an example of a layout structure according to the fourth embodiment.
Figure 19:
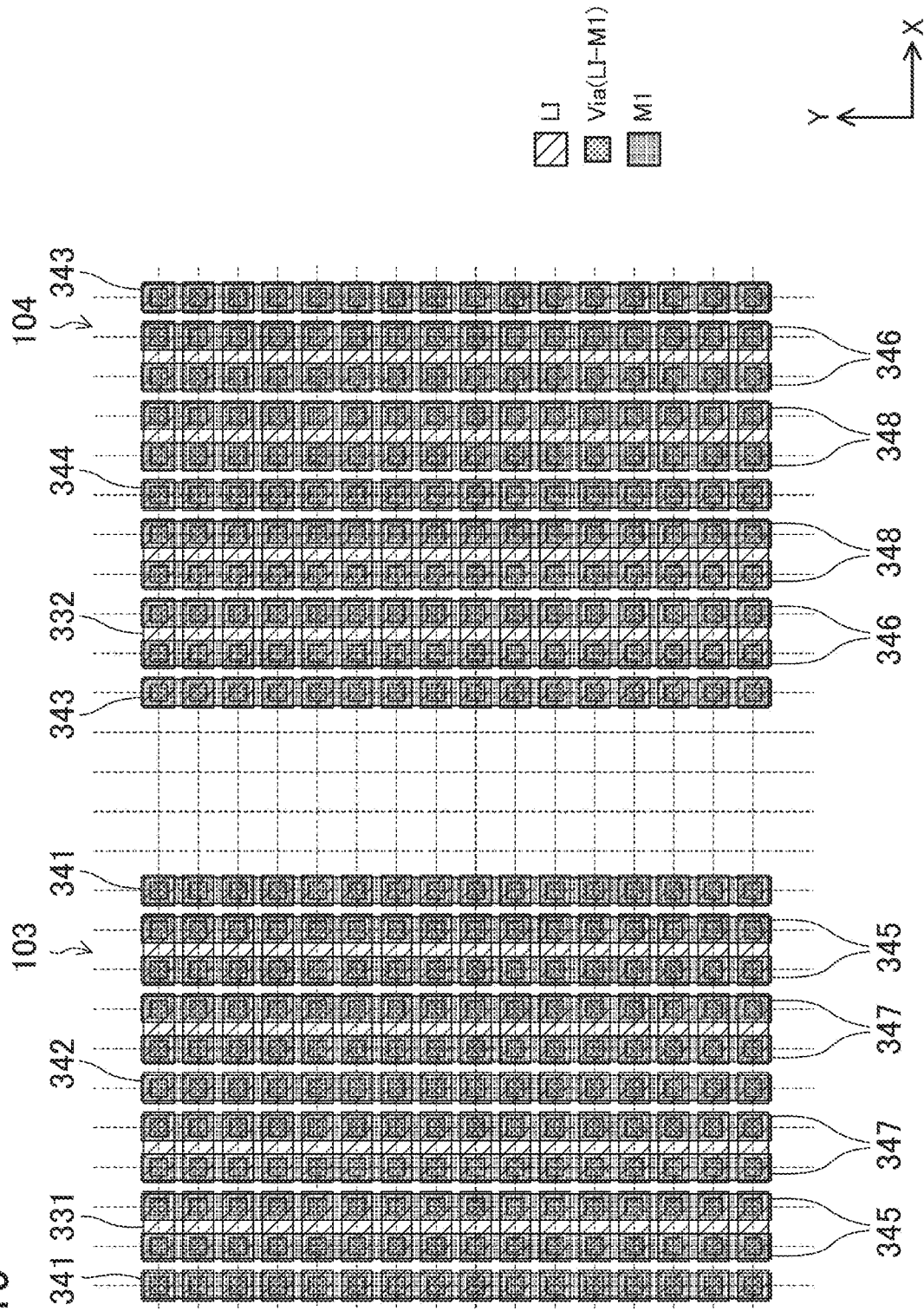
FIG. 19 is a layer-by-layer plan view showing the layout structure according to the fourth embodiment.
Figure 20:
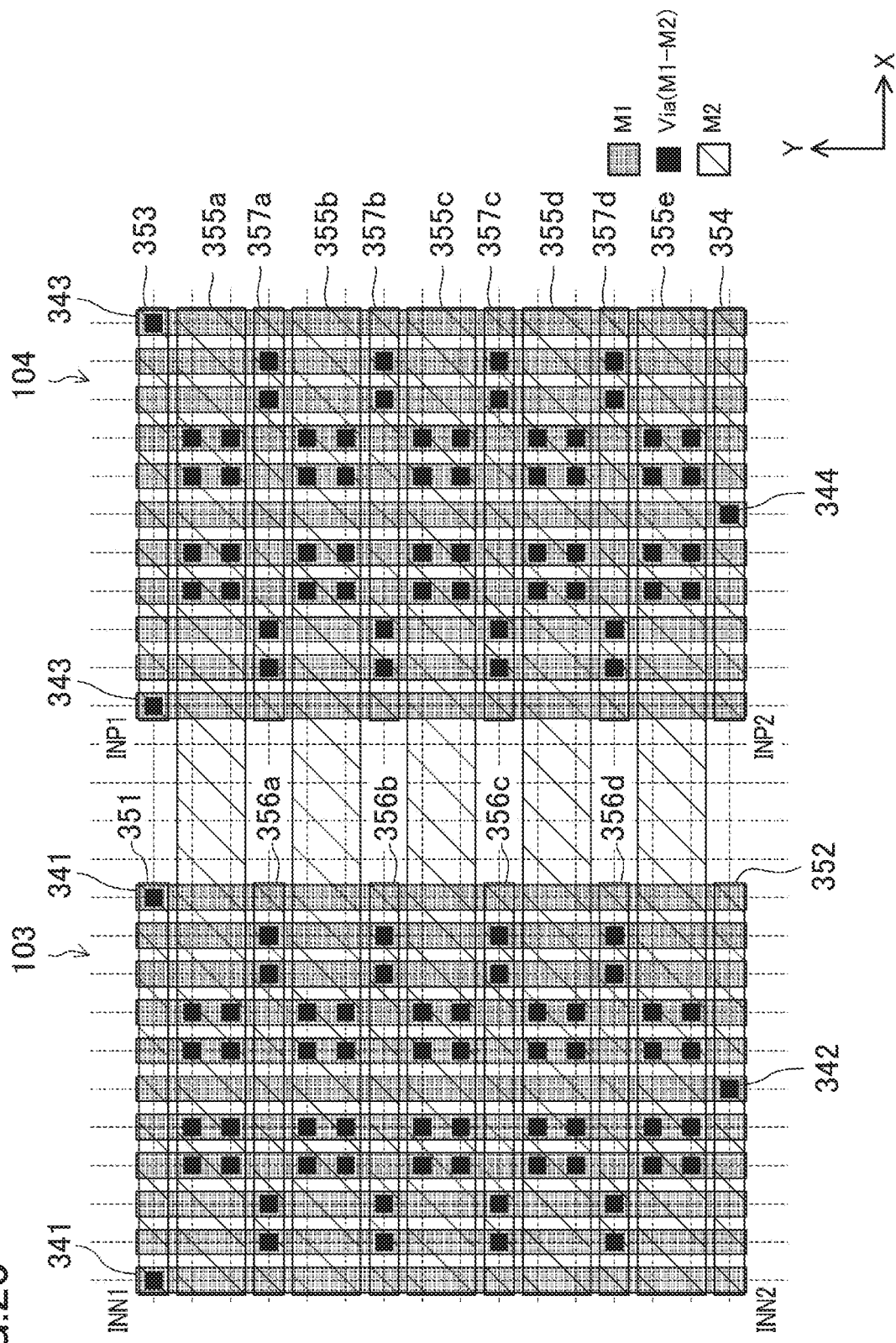
FIG. 20 is a layer-by-layer plan view showing the layout structure according to the fourth embodiment.
Figure 21:
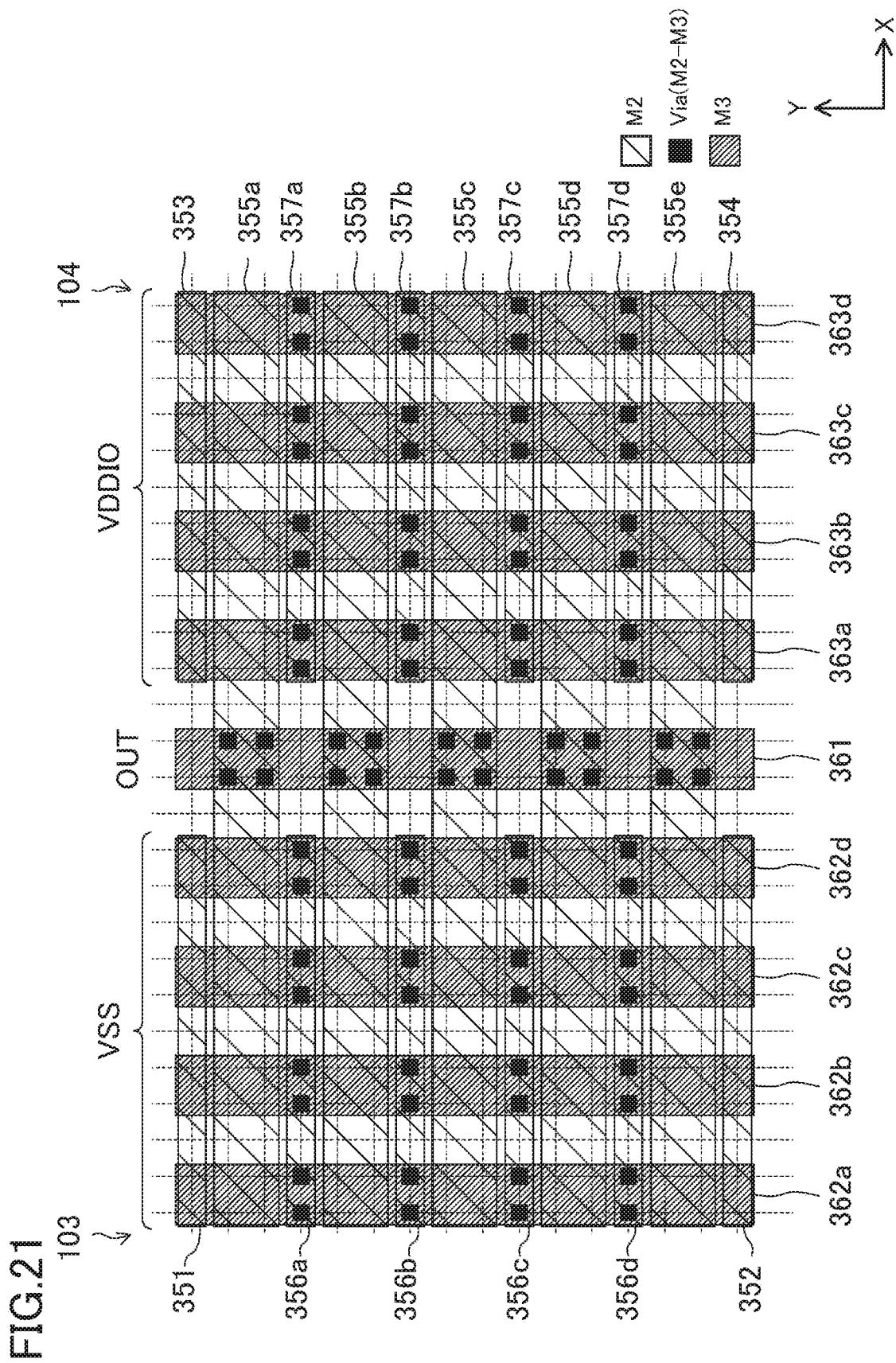
FIG. 21 is a layer-by-layer plan view showing the layout structure according to the fourth embodiment.

FIGS. 18 to 21 are layer-to-layer plan views showing an example of the layout structure of the transistors P21, P22, N21, and N22 according to this embodiment. Specifically, FIG. 18 shows VNW FETs and layers below them, FIG. 19 shows local interconnects and M1 interconnects above the VNW FETs, FIG. 20 shows M1 and M2 interconnects, and FIG. 21 shows M2 and M3 interconnects. Note that an overall plan view and cross-sectional views are omitted here because they can be easily drawn by analogy from the first embodiment.

In the plan views such as FIG. 18, the left part of the figure corresponds to the n-type output transistor portion 103 and implements the transistors N21 and N22 in the circuit of FIG. 14. Also, the right part of the figure corresponds to the p-type output transistor portion 104 and implements the transistors P21 and P22 in the circuit of FIG. 14.

As shown in FIG. 18, in the n-type output transistor portion 103, a total of 128 n-type VNWs V1 are formed in an array of 8 columns in the X direction and 16 rows in the Y direction. In the n-type output transistor portion 103, a bottom region 311 is formed almost over the entire surface, and the bottoms of the 128 VNWs V1 are connected to the bottom region 311.

The VNWs V1 are placed in groups of two columns in the X direction. These groups of two columns of VNWs V1 are herein denoted by gn1 to gn4. As will be described later, the transistor N21 is implemented by 64 VNWs V1 belonging to the groups gn1 and gn4. Also, the transistor N22 is implemented by 64 VNWs V1 belonging to the groups gn2 and gn3. Spacing is provided between the groups gn2 and gn3.

In each of the groups gn1 to gn4, the gates of VNWs V1 adjacent in the X direction are mutually connected. Gate interconnects 321 are drawn from the group gn1 leftward as viewed from the figure, and gate interconnects 322 are drawn from the group gn4 rightward as viewed from the figure. In the groups gn2 and gn3, four VNWs V1 adjacent in the X direction are connected with one another through a gate interconnect 323. That is, such gate interconnects 323 are gate interconnects drawn from the group gn2 rightward and also gate interconnects drawn from the group gn3 leftward as viewed from the figure.

Vias 327a for connection with local interconnects in an upper layer are formed on the gate interconnects 321, 322, and 323.

Likewise, in the p-type output transistor portion 104, a total of 128 p-type VNWs V2 are formed in an array of 8 columns in the X direction and 16 rows in the Y direction. In the p-type output transistor portion 104, a bottom region 312 is formed almost over the entire surface, and the bottoms of the 128 VNWs V2 are connected to the bottom region 312.

The VNWs V2 are placed in groups of two columns in the X direction. These groups of two columns of VNWs V2 are herein denoted by gp1 to gp4. As will be described later, the transistor P21 is implemented by 64 VNWs V2 belonging to the groups gp1 and gp4. Also, the transistor P22 is implemented by 64 VNWs V2 belonging to the groups gp2 and gp3. Spacing is provided between the groups gp2 and gp3.

Gate interconnects 324 are drawn from the group gp1 leftward as viewed from the figure, and gate interconnects 325 are drawn from the group gp4 rightward as viewed from the figure. In the groups gp2 and gp3, four VNWs V2 adjacent in the X direction are connected with one another through a gate interconnect 326. That is, such gate interconnects 326 are gate interconnects drawn from the group gp2 rightward and also gate interconnects drawn from the group gp3 leftward as viewed from the figure.

Vias 328a for connection with local interconnects in an upper layer are formed on the gate interconnects 324, 325, and 326.

As shown in FIG. 19, in each of the groups gn1 to gn4, the tops of VNWs V1 adjacent in the X direction are mutually connected through a local interconnect 331. Likewise, in each of the groups gp1 to gp4, the tops of VNWs V2 adjacent in the X direction are mutually connected through a local interconnect 332.

As shown in FIG. 21, in an M3 interconnect layer, M3 interconnects 361, 362a to 362d, and 363a to 363d extend in the Y direction. The M3 interconnect 361 outputs the output signal OUT and corresponds to the output signal line according to the present disclosure. The M3 interconnects 362a to 362d are interconnects that supply the power supply voltage VSS and correspond to the power supply interconnect 7. The M3 interconnects 363a to 363d are interconnects that supply the power supply voltage VDDIO and correspond to the power supply interconnect 6.

As shown in FIGS. 20 and 21, in an M2 interconnect layer, M2 interconnects 351, 352, 353, 354, 355a to 355e, 356a to 356d, and 357a to 357d extend in the X direction. The M2 interconnect 351 supplies the output control signal INN1. The M2 interconnect 352 supplies the output control signal INN2. The M2 interconnect 353 supplies the output control signal INP1. The M2 interconnect 354 supplies the output control signal INP2. The M2 interconnects 355a to 355e are connected with the M3 interconnect 361 that outputs the output signal OUT through vias. The M2 interconnects 356a to 356d are connected with the M3 interconnects 362a to 362d that supply the power supply voltage VSS through vias. The M2 interconnects 357a to 357d are connected with the M3 interconnects 363a to 363d that supply the power supply voltage VDDIO through vias.

As shown in FIGS. 19 and 20, in an M interconnect layer, M interconnects 341, 342, 343, 344, 345, 346, 347, and 348 extend in the Y direction. The M1 interconnects 341, placed in the n-type output transistor portion 103, are connected with the M2 interconnect 351 that supplies the output control signal INN1 through vias. The M1 interconnect 342, placed in the n-type output transistor portion 103, is connected with the M2 interconnect 352 that supplies the output control signal INN2 through a via. Likewise, M1 interconnects 343, placed in the p-type output transistor portion 104, are connected with the M2 interconnect 353 that supplies the output control signal INP1 through vias. The M1 interconnect 344, placed in the p-type output transistor portion 104, is connected with the M2 interconnect 354 that supplies the output control signal INP2 through a via.

The M1 interconnects 345 are placed, in the n-type output transistor portion 103, in groups of two to extend above the groups gn1 and gn4. The M interconnects 345 are connected with the tops of the VNWs V1 of the groups gn1 and gn4 through the local interconnects 331, and also connected with the M2 interconnects 356a to 356d through vias. The M1 interconnects 346 are placed, in the p-type output transistor portion 104, in groups of two to extend above the groups gp1 and gp4. The M1 interconnects 346 are connected with the tops of the VNWs V2 of the groups gp1 and gp4 through the local interconnects 332, and also connected with the M2 interconnects 357a to 357d through vias.

The M1 interconnects 347 are placed, in the n-type output transistor portion 103, in groups of two to extend above the groups gn2 and gn3. The M1 interconnects 347 are connected with the tops of the VNWs V1 of the groups gn2 and gn3 through the local interconnects 331, and also connected with the M2 interconnects 355a to 355e through vias. The M1 interconnects 348 are placed, in the p-type output transistor portion 104, in groups of two to extend above the groups gp2 and gp3. The M1 interconnects 348 are connected with the tops of the VNWs V2 of the groups gp2 and gp3 through the local interconnects 332, and also connected with the M2 interconnects 355a to 355e through vias.

With the layout structure as described above, the tops of 64 VNWs V1 belonging to the groups gn1 and gn4, out of the 128 VNWs V1 formed in the n-type output transistor portion 103, are connected with the M3 interconnects 362a to 366d that supply the power supply voltage VSS through the local interconnects 331, the M1 interconnects 345, and the M2 interconnects 356a to 356d. The bottoms thereof are connected with the bottom region 311. The gates thereof are connected with the M2 interconnect 351 that supplies the output control signal INN1 through the gate interconnects 321 and 322, the vias 327a, and the M1 interconnects 341. Also, the tops of 64 VNWs V1 belonging to the groups gn2 and gn3, out of the 128 VNWs V1 formed in the n-type output transistor portion 103, are connected with the M3 interconnect 361 that outputs the output signal OUT through the local interconnects 331, the M1 interconnects 347, and the M2 interconnects 355a to 355e. The bottoms thereof are connected with the bottoms of 64 VNWs V1 belonging to the groups gn1 and gn4 through the bottom region 311. The gates thereof are connected with the M2 interconnect 352 that supplies the output control signal INN2 through the gate interconnects 323, the vias 327a, and the M1 interconnect 342.

Thus, the transistor N21 in the circuit diagram of FIG. 14 is implemented by 64 VNWs V1 belonging to the groups gn1 and gn4, out of the 128 VNWs V1 formed in the n-type output transistor portion 103, and the transistor N22 in the circuit diagram of FIG. 14 is implemented by 64 VNWs V1 belonging to the groups gn2 and gn3.

Also, the tops of 64 VNWs V2 belonging to the groups gp1 and gp4, out of the 128 VNWs V2 formed in the p-type output transistor portion 104, are connected with the M3 interconnects 363a to 363d that supply the power supply voltage VDDIO through the local interconnects 332, the M1 interconnects 346, and the M2 interconnects 357a to 357d. The bottoms thereof are connected with the bottom region 312. The gates thereof are connected with the M2 interconnect 353 that supplies the output control signal INP1 through the gate interconnects 324 and 325, the vias 328a, and the M1 interconnects 343. Also, the tops of 64 VNWs V2 belonging to the groups gp2 and gp3, out of the 128 VNWs V2 formed in the p-type output transistor portion 104, are connected with the M3 interconnect 361 that outputs the output signal OUT through the local interconnects 332, the M1 interconnects 348, and the M2 interconnects 355a to 355e. The bottoms thereof are connected with the bottoms of 64 VNWs V2 belonging to the groups gp1 and gp4 through the bottom region 312. The gates thereof are connected with the M2 interconnect 354 that supplies the output control signal INP2 through the gate interconnects 326, the vias 328a, and the M1 interconnect 344.

Thus, the transistor P21 in the circuit diagram of FIG. 14 is implemented by 64 VNWs V2 belonging to the groups gp1 and gp4, out of the 128 VNWs V2 formed in the p-type output transistor portion 104, and the transistor P22 in the circuit diagram of FIG. 14 is implemented by 64 VNWs V2 belonging to the groups gp2 and gp3.

According to this embodiment, therefore, an output circuit that passes a large current through an output pad can be configured using VNW FETs.

In the configuration described above, the gate interconnects 321 to 326 are formed to extend in the X direction and have the same interconnect width. The local interconnects 331 and 332 are formed to extend in the X direction and have the same interconnect width. The M1 interconnects 341 to 348 are formed to extend in the Y direction and have the same interconnect width. With the direction and width of the interconnects being the same in each interconnect layer as described above, the fabrication becomes easy and the fabrication precision improves. Note that, although the gate interconnects 321 to 326, the local interconnects 331 and 332, and the M1 interconnects 341 to 348 appear to have the same width in the illustrated configuration, it is unnecessary to ensure the same interconnect width over the different interconnect layers. If only the direction and width of interconnects are the same in one interconnect layer, the fabrication will be easy and the fabrication precision will improve.

In the configuration described above, the M3 interconnect 361 is connected with the tops of the VNWs V1 of the groups gn2 and gn3 constituting the transistor N22 and the tops of the VNWs V2 of the groups gp2 and gp3 constituting the transistor P22. This reduces the resistance value generated up to the output signal line compared with the case of connecting the M3 interconnect 361 with the bottoms of the VNWs V1 and V2.

The vias 327a for supplying the output control signals INN1 and INN2 may be placed in two or more columns lying side by side. Likewise, the vias 328a for supplying the output control signals INP1 and INP2 may be placed in two or more columns lying side by side.

In the embodiment described above, the bottom region 311 is formed integrally over the n-type output transistor portion 103, and the bottom region 312 is formed integrally over the p-type output transistor portion 104. Alternatively, the bottom regions 311 and 312 may be formed in separate forms. For example, the bottom region 311 may be divided to form individual bottom regions for the groups gn1 and gn2 and the groups gn3 and gn4.

Other Embodiments

The placement positions of the VNWs V1 and V2 are not limited to those described in the above embodiments, and the number of VNWs V1 or V2 constituting each transistor of the output circuit is not limited to those described in the above embodiments.

Four interconnects each for supply of the power supply voltages VSS and VDDIO are formed in the M2 interconnect layer in the first and third embodiments and in the M3 interconnect layer in the second and fourth embodiments. However, the forms of interconnects for supply of the power supply voltages are not limited to these. For example, in the first and third embodiments, interconnects for supply of the power supply voltages may be formed in an interconnect layer other than the M2 interconnect layer. Otherwise, interconnects for supply of the power supply voltages may be formed in a plurality of interconnect layers, or the number of interconnects each may be any number other than four.

One interconnect each for supply of the output control signals INN and INP is formed in the M2 interconnect layer in the first and second embodiments, and one interconnect each for supply of the output control signals INN1, INN2, INP1, and INP2 is formed in the M2 interconnect layer in the third and fourth embodiment. However, the forms of interconnects for supply of the output control signals are not limited to these. For example, interconnects for supply of the output control signals may be formed in an interconnect layer other than the M2 interconnect layer, or may be formed in a plurality of interconnect layers. Otherwise, a plurality of interconnects each may be formed in the same interconnect layer. Also, the placement positions of interconnects for supply of the output control signals are not limited to those described in the above embodiments. For example, in the first embodiment, the interconnect for supply of the output control signal INP may be placed in a lower part of the p-type output transistor portion 102 as viewed from the figure.

According to the present disclosure, an output circuit that passes a large current through an output pad can be configured using VNW FETs. The present disclosure is therefore useful for improving the performance of a semiconductor chip, for example.

What is claimed is:

1. An output circuit for outputting a signal from a semiconductor integrated circuit, comprising:
   first and second transistors of a first conductivity type provided in series between a first power supply and an output signal line,
   wherein the first transistor receives a first output control signal at its gate, and the second transistor receives a second output control signal at its gate,
   the first transistor includes a plurality of first vertical nanowire (VNW) FETs placed in an array in a first direction and a second direction perpendicular to the first direction,
   the plurality of first VNW FETs have tops to which a first power supply voltage is supplied from the first power supply, gates to which the first output control signal is supplied, and bottoms connected to a first bottom region,
   the second transistor includes a plurality of second VNW FETs placed in an array in the first direction and the second direction, and the plurality of second VNW FETs have tops connected to the output signal line, gates to which the second output control signal is supplied, and bottoms connected to the first bottom region.

2. The output circuit of claim 1, further comprising:
third and fourth transistors of a second conductivity type provided in series between a second power supply and the output signal line,
wherein the third transistor receives a third output control signal at its gate, and the fourth transistor receives a fourth output control signal at its gate,
the third transistor includes a plurality of third VNW FETs placed in an array in the first direction and the second direction,
the plurality of third VNW FETs have tops to which a second power supply voltage is supplied from the second power supply, gates to which the third output control signal is supplied, and bottoms connected to a second bottom region,
the fourth transistor includes a plurality of fourth VNW FETs placed in an array in the first direction and the second direction, and
the plurality of fourth VNW FETs have tops connected to the output signal line, gates to which the fourth output control signal is supplied, and bottoms connected to the second bottom region.

3. The output circuit of claim 1, wherein
the plurality of first VNW FETs and the plurality of second VNW FETs are placed adjacently in the first direction,
the plurality of first VNW FETs receive the first output control signal at their gates from the side opposite to the plurality of second VNW FETs in the first direction, and
the plurality of second VNW FETs receive the second output control signal at their gates from the side opposite to the plurality of first VNW FETs in the first direction.

4. An output circuit for outputting a signal from a semiconductor integrated circuit, comprising:
a first transistor of a first conductivity type provided between a first power supply and an output signal line and configured to receive a first output control signal at its gate,
wherein the first transistor includes a plurality of first vertical nanowire (VNW) FETs placed in an array in a first direction and a second direction perpendicular to the first direction,
the plurality of first VNW FETs have tops connected to the output signal line, bottoms to which a first power supply voltage is supplied from the first power supply, and gates to which the first output control signal is supplied,
in a first interconnect layer, bottom interconnects connected to the bottoms of the plurality of first VNW FETs and top interconnects connected to the tops of the plurality of first VNW FETs are formed to extend in the second direction, and
the top interconnects occupy a larger area than the bottom interconnects as viewed from top in a region in which the plurality of first VNW FETs are placed.

5. The output circuit of claim 4, further comprising:
a second transistor of a second conductivity type provided between a second power supply and the output signal line and configured to receive a second output control signal at its gate,
wherein the second transistor includes a plurality of second VNW FETs placed in an array in the first direction and the second direction, and
the plurality of second VNW FETs have tops connected to the output signal line, bottoms to which a second power supply voltage is supplied from the second power supply, and gates to which the second output control signal is supplied.

* * * * *